(12) United States Patent
Kawase et al.

(10) Patent No.: US 7,425,474 B2
(45) Date of Patent: Sep. 16, 2008

(54) METHOD OF MANUFACTURING THIN FILM TRANSISTOR, METHOD OF MANUFACTURING ELECTRO-OPTICAL DEVICE THIN FILM TRANSISTOR, AND ELECTRO-OPTICAL DEVICE

(75) Inventors: Takeo Kawase, Suwa (JP); Satoshi Kimura, Fujumi-cho (JP); Hidemichi Furihata, Chino (JP); Mitsuaki Harada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 302 days.

(21) Appl. No.: 11/060,726

(22) Filed: Feb. 18, 2005

(65) Prior Publication Data

US 2005/0186699 A1    Aug. 25, 2005

(30) Foreign Application Priority Data

Feb. 20, 2004    (JP) .............................. 2004-045425

(51) Int. Cl.
*H01L 21/00*    (2006.01)
*H01L 21/84*    (2006.01)

(52) U.S. Cl. ....................................... 438/151; 438/142
(58) Field of Classification Search ................. 438/151, 438/142
See application file for complete search history.

(56) References Cited

U.S. PATENT DOCUMENTS

| | | | |
|---|---|---|---|
| 4,749,449 A * | 6/1988 | Scott | .......................... 205/136 |
| 4,984,040 A * | 1/1991 | Yap | .............................. 257/60 |
| 5,705,826 A | 1/1998 | Aratani et al. | |
| 5,854,139 A | 12/1998 | Aratani et al. | |
| 6,197,663 B1 * | 3/2001 | Chandross et al. | .......... 438/455 |
| 6,802,985 B1 | 10/2004 | Chikama et al. | |

FOREIGN PATENT DOCUMENTS

| | | |
|---|---|---|
| JP | A-4-326719 | 11/1992 |
| JP | 05-055568 A | 3/1993 |
| JP | A-8-18125 | 1/1996 |
| JP | A-8-136935 | 5/1996 |
| JP | A-9-78250 | 3/1997 |
| JP | A-10-310873 | 11/1998 |
| JP | A-2001-43798 | 2/2001 |
| JP | A-2001-135168 | 5/2001 |
| JP | A-2003-149831 | 5/2003 |
| WO | WO 01/47043 A1 | 6/2001 |
| WO | WO 01/47045 A1 | 6/2001 |

* cited by examiner

*Primary Examiner*—Carl Whitehead, Jr.
*Assistant Examiner*—Candice Y Chan
(74) *Attorney, Agent, or Firm*—Oliff & Berridge, PLC

(57) ABSTRACT

A method of manufacturing a transistor includes the step of forming on a substrate a source electrode and drain electrode by selective electroless plating after patterning a charge control agent attached to the substrate using light, and the step of forming an organic semiconductor, a gate insulation layer, and a gate electrode.

9 Claims, 10 Drawing Sheets

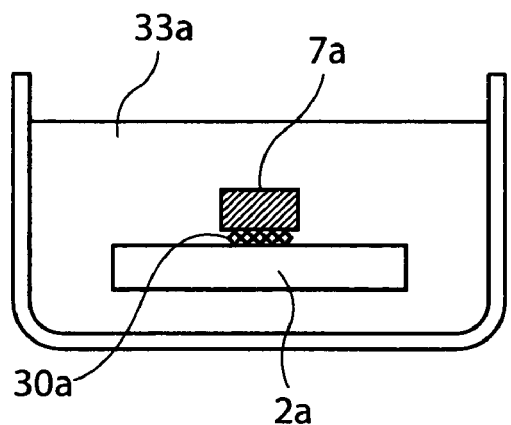
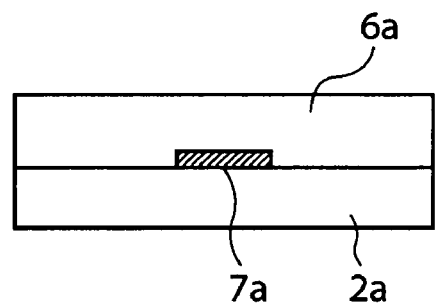
FIG. 6A        FIG. 6B
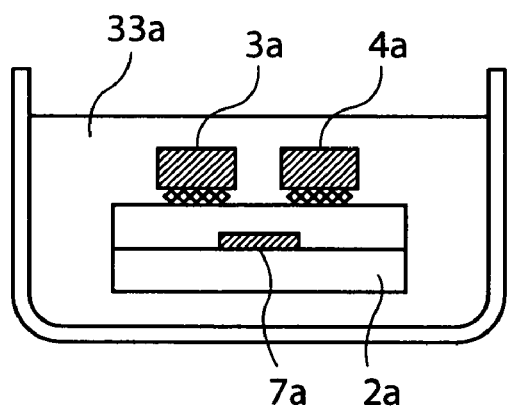
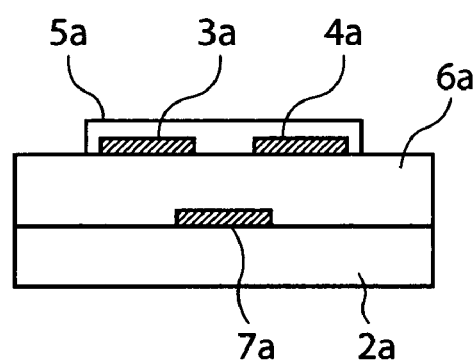
FIG. 6C        FIG. 6D

METHOD OF MANUFACTURING THIN FILM TRANSISTOR, METHOD OF MANUFACTURING ELECTRO-OPTICAL DEVICE THIN FILM TRANSISTOR, AND ELECTRO-OPTICAL DEVICE

RELATED APPLICATION

This application claims priority to Japanese Application No. 2004-45425, filed Feb. 20, 2004, whose contents are explicitly incorporated herein by reference.

FIELD OF THE INVENTION

The present invention relates to a method of manufacturing a transistor, a method of manufacturing an electro-optical device, a transistor, and an electro-optical device.

BACKGROUND

In recent years, transistors using organic materials (organic semiconductor materials) possessing electrically conductive properties similar to semiconductors have been under development. The transistors have advantages of good adaptability to low-profile and weight-saving, flexibility, low material cost and so on. Transistors can be used to realize switching elements for flexible displays or the like.

To realize switching elements, a structure for transistors is proposed in which a source electrode and a drain electrode are formed on a substrate with an organic semiconductor layer, a gate insulating layer, and a gate electrode stacked, respectively.

Japanese Unexamined Patent Publication No. 5-55568 discloses that a vacuum deposition method is used for forming a gate electrode, a source electrode, and a drain electrode.

By forming an insulating layer and an organic semiconductor layer using the vacuum deposition method in addition to forming the gate electrode, the source electrode, and the drain electrode using the vacuum deposition method as described in Japanese Unexamined Patent Publication No. 5-55568, a high-performance transistor can be manufactured with good reproducibility.

However, the vacuum deposition method requires a large-scale facility, and can present problems of high-cost and so on resulting from large power consumption required to form the films.

International Patent Publication Nos. WO/0147045 and WO/0147043 disclose that the gate electrode, the source electrode, drain electrode, the insulating layer, and the organic semiconductor layer are formed as films by a wet process under atmospheric pressure. As such, a transistor can be manufactured at low cost.

However, in practice, the transistors described in International Patent Publication Nos. WO/0147045 and WO/0147043 do not possess the properties which lead to high performance and good reproducibility when compared with transistors manufactured by the vacuum deposition process.

Aspects of the present invention provide a method of manufacturing a high performance transistor using a relatively simple process, and a transistor circuit equipped with a transistor manufactured according to aspects of the present invention.

A method of manufacturing a transistor according to the present invention comprises: (a) attaching a charge control agent to a first region of a substrate; (b) irradiating a part of the first region with light; (c) selectively attaching a catalytic agent or a precursor of the catalytic agent to the irradiated part of the first region or the first region; (d) depositing a metallic layer from a metallic salt solution on the area attached with one of the catalytic agent and the precursor of the catalytic agent to form one or more electrodes; and (e) forming a semiconductor layer on the electrodes directly or via an insulation layer.

According to one aspect of the present invention, in the method of manufacturing a transistor, the charge control agent is an organic charge control agent; in step (a), the organic charge control agent is attached so as to obtain a substantially even first charging condition in the first region; and in step (b), the charging condition of the irradiated area irradiated with the light is changed to a condition different from the first charging condition by the irradiation with the light.

Further, in step (b), irradiation with the light can be performed so as to decompose the charge control agent. Further, the light can be vacuum ultraviolet radiation.

Still further, in the above manufacturing method, the charge control agent can be a surfactant. In this case, the surfactant is preferably a cationic surfactant.

Further, in one aspect, the catalytic agent or the precursor of the catalytic agent can include palladium.

Further, in the method of manufacturing a transistor according to one aspect of the present invention, the difference between the first charging condition and the charging condition of the irradiated area is greater than or equal to 10 mV in zeta potential in water. The difference is preferably greater than or equal to 30 mV.

In a further aspect, the metallic layer can include at least one metal of Pt, Pd, Ni, Cu, and Au.

Further, in the method of manufacturing a transistor according to another aspect of the present invention, the semiconductor layer can comprise an organic semiconductor. Further, the organic semiconductor can be obtained by coating a solution. Still further, the organic semiconductor can be a conjugated polymer.

Further, in the method of manufacturing a transistor according to another aspect of the present invention, the electrodes described above can be a source electrode and a drain electrode. Still further, the method can comprise (f) forming a gate electrode by applying a coating of one of a solution and a dispersion fluid of an electrically conductive material to overlap a region between the source electrode and the drain electrode. And, the coating of one of the solution and the dispersion fluid of the electrically conductive material can be applied using an inkjet coating process.

Alternatively, the method can comprise prior to step (a): (g) forming a gate electrode; and (h) forming an insulation layer on the gate electrode, wherein the source electrode and the drain electrode are formed on the insulation layer.

Further, according to an aspect of the present invention, a method of manufacturing an electro-optical device equipped with a substrate for holding an electro-optical material, comprises: (a) attaching a charge control agent to a first region of the substrate; (b) irradiating a part of the first region with light; (c) selectively attaching a catalytic agent or a precursor of the catalytic agent to the irradiated part of the first region or the first region; (d) depositing a metallic layer from a metallic salt solution on the area attached with one of the catalytic agent and the precursor of the catalytic agent to form one or more electrodes; and (e) forming a semiconductor layer on the electrodes directly or via an insulation layer.

Further, a transistor according to an aspect of the present invention can be manufactured by the method of manufacturing a transistor described above.

Further, an electro-optical device according to the present invention can be equipped with a transistor manufactured by the method of manufacturing a transistor described above.

According to the aforementioned present invention, a transistor and a transistor circuit can be formed with less waste of materials, low cost, and high precision.

BRIEF DESCRIPTION OF THE DRAWINGS

FIGS. 1A and 1B are views showing an illustrative transistor according to an aspect, in which FIG. 1A shows a vertical cross-sectional view and FIG. 1B shows a plan view.

FIGS. 5A and 5B are views showing the transistor according to another aspect, in which FIG. 5A shows a vertical cross-sectional view and FIG. 5B shows a plan view.

FIGS. 6A through 6D are views (vertical cross-sectional views) for explaining another illustrative manufacturing method of the transistor shown in FIGS. 5A and 5B.

DETAILED DESCRIPTION OF THE INVENTION

The following detailed description describes a method of manufacturing a transistor, a transistor, and a transistor circuit according to illustrative aspects of the present invention.

First, an illustrative transistor and manufacturing method thereof according to the present invention will be described.

Figure 1A:
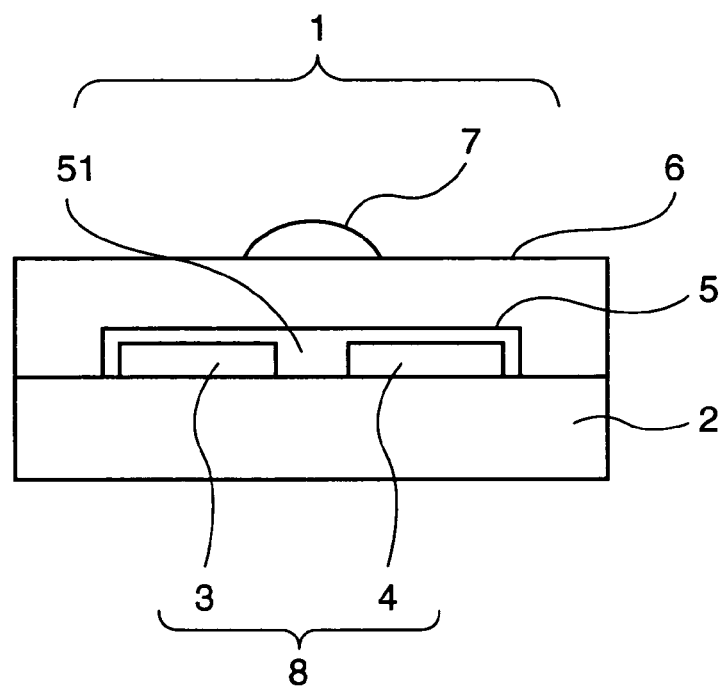
Figure 1B:
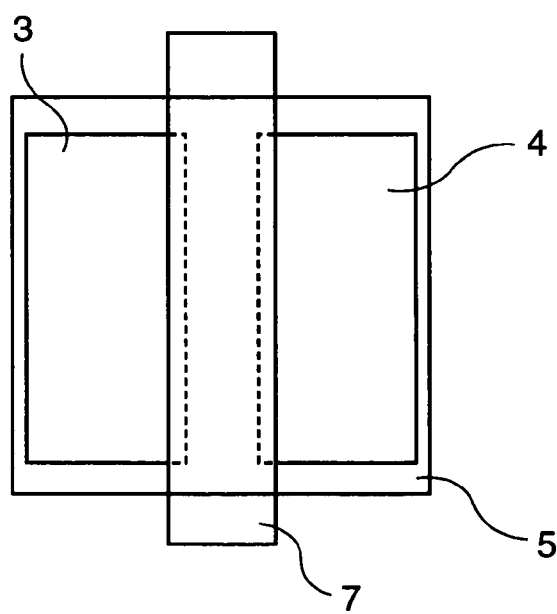

FIGS. 1A and 1B are views showing an illustrative transistor according to an aspect of the present invention, in which FIG. 1A shows a vertical cross-sectional view, and FIG. 1B shows a plan view. For purposes of the following description, the upper portion of FIG. 1A will be referred to as the "upper side" and the lower portion thereof will be referred to as "lower side".

A transistor 1 shown in FIGS. 1A and 1B is provided on a substrate 2, and includes a source electrode 3, a drain electrode 4, an organic semiconductor layer (an organic layer) 5, a gate insulating layer 6, and a gate electrode 7 stacked on the substrate 2, respectively.

Specifically, the transistor 1 is provided on the substrate 2 so that the source electrode 3 and the drain electrode 4 are separated. The organic semiconductor layer 5 is provided so as to cover the electrodes 3 and 4. Further, the gate insulating layer 6 is provided on the organic semiconductor layer 5, on which the gate electrode 7 is provided so as to overlap at least an area between the source electrode 3 and the drain electrode 4.

In the transistor 1, a part of the organic semiconductor layer 5 positioned between the source electrode 3 and the drain electrode 4 is defined as a channel region 51 through which carriers are transferred. Hereinafter, in the channel region 51, the length in the carrier transport direction, namely the distance between the source electrode 3 and the drain electrode 4 is referred to as a channel length L, and the length in the direction perpendicular to the channel length L direction is referred to as a channel width W.

The transistor 1 described above is a transistor with a configuration in which the source electrode 3 and the drain electrode 4 are provided via the gate insulating layer 6 nearer to the substrate 2 than the gate electrode 7, namely a transistor with the top-gate structure.

Hereinafter, each part of the transistor will be sequentially described.

The substrate 2 is a member for supporting each of the layers (each of the sections) composing the transistor 1. As the substrate 2, a plastic substrate (a resin substrate) made of polyimide, polyethylene terephthalate (PET), polyethylene naphthalate (PEN), polyethersulfone (PES), aromatic polyester (liquid crystal polymer), or the like, a grass substrate, a quartz substrate, a silicon substrate, a gallium arsenide substrate and so on, for example, can be used. If the transistor needs to be flexible, the resin substrate can be selected as the substrate 2.

A foundation layer can be provided to the substrate 2. The foundation layer can be provided to, for example, prevent ions from diffusing from the surface of the substrate 2, or for enhancing adhesiveness (joining property) of the source electrode 3 and the drain electrode 4 with the substrate 2.

A material for the foundation layer is not particularly limited, but when a glass substrate is used as the substrate 2, silicon dioxide ($SiO_2$), silicon nitride (SiN), or the like can be used as the material for the foundation layer.

The source electrode 3 and drain electrode 4 are provided on the substrate 2 side by side along the channel length L direction with a predetermined distance.

As a material for forming the source electrode 3 and the drain electrode 4, a material that can be deposited by an electroless plating process described below can be used.

Specifically, metal materials such as Ni, Cu, Co, Au, Pd, can be used alone or in combination.

The thicknesses (in average) of the source electrode 3 and the drain electrode 4 are not limited, but may be in a range of about 30 through 300 nm, and preferably in a range of about 50 through 150 nm. According to the electrode forming method of the present invention, such a thin electrode can precisely be formed.

The distance (edge-to-edge distance) between the source electrode 3 and the drain electrode 4, namely the channel length L may be in a range of about 2 through 30 μm, and preferably in a range of about 5 through 20 μm. If the channel length L is smaller than the lower limit value described above, there may be margins of error in the channel lengths of the obtained transistors 1, which may cause fluctuations in the characteristics (transistor characteristics). In contrast, if the L is greater than the upper limit value described above, the value of the drain current becomes smaller, which may cause an insufficient performance of the transistor 1.

The channel width W may be in a range of about 0.05 through 5 mm, and more specifically in a range of about 0.1 through 2 mm. If the channel width W is narrower than the lower limit value mentioned above, the value of the drain current becomes smaller, which may cause an insufficient performance of the transistor 1. In contrast, if the channel width is wider than the upper limit value, the size of the transistor 1 becomes larger, and an increased parasitic capacitance or increased leak current to the gate electrode 7 via the gate insulating layer 6 may result.

Further, on the substrate 2, the organic semiconductor layer 5 is provided so as to cover the source electrode 3 and the drain electrode 4.

The organic semiconductor layer 5 may be made mainly of an organic semiconductor material (an organic material presenting with an electrically conductive property similar to a semiconductor material).

The organic semiconductor layer 5 may be arranged substantially parallel to the channel length L direction at least in a channel region 51. According to this structure, the carrier mobility in the channel region 51 increases resulting in faster operational speed of the transistor 1.

As the organic semiconductor material, for example, small molecule organic semiconductor materials such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, oligothiophene, phthalocyanine, or derivatives of the above, or polymeric semiconductor materials such as poly-N-vinylcarbazole, polyvinylpyrene, polyvinylanthracene, polythiophene, polyhexylthiophene, poly(p-phenylenevinylene), polythenylenevinylene, polyarylamine, pyrene-formaldehyde resin, ehtylcarbazole-formaldehyde resin, fluorene-bithiophene copolymer, fluorene-arylamine copolymer, or derivatives of the above can be cited, and these materials can be used alone or in combination, and in particular, the polymeric organic semiconductor materials can be used.

The polymeric organic semiconductor materials can be formed as films by simple processes, and easily arranged in predetermined directions. Among these materials, fluorene-bithiophene copolymer or polyarylamine may be used due to their strong oxidation resistance and stability in the atmosphere.

Further, the organic semiconductor layer 5 composed mainly of a polymeric organic semiconductor material, is suitable for an application to transistors used as switching elements for flexible displays. Such an organic semiconductor layer 5 provides excellent flexibility and can be used for forming thinner and/or light-weight products.

The thickness (in average) of the organic semiconductor layer 5 can be in a range about 0.1 through 1000 nm, and preferably in a range of about 1 through 500 nm, and further preferably in a range of about 1 through 100 nm.

Note that the organic semiconductor layer 5 is not limited to being configured so as to cover the source electrode 3 and the drain electrode 4, but can be formed on at least an area (the channel region 51) defined between the source electrode 3 and the drain electrode 4.

The gate insulating layer 6 can be provided on the organic semiconductor layer 5.

The gate insulating layer 6 can be provided for insulating the gate electrode 7 from the source electrode 3 and the drain electrode 4.

The gate insulating layer 6 can be composed mainly of an organic material (in particular an organic polymeric material). The gate insulating layer 6 composed mainly of an organic polymeric material can easily be formed, and capable of enhancing adhesiveness with the organic semiconductor layer 5.

As such an organic polymeric material, for example, acrylic resin such as polystyrene, polyimide, polyamideimide, polyvinylphenylene, polycarbonate (PC), or polymethylmethacrylate (PMMA), fluorinated resin such as polytetrafluoroethylene (PTFE), phenolic resin such as polyvinylphenol or novolak resin, olefinic resin such as polyethylene, polypropylene, polyisobutylene, or polybutene can be cited, and one or more of these materials can be used alone or in combination.

The thickness (in average) of the gate insulating layer 6 is not particularly limited, but may be in a range of about 10 through 5000 nm, and is preferably in a range of about 100 through 1000 nm. By arranging the thickness of the gate insulating layer 6 within the range described above, the transistor 1 can be prevented from becoming larger (in particular, increasing the thickness thereof) while the source electrode 3 and the drain electrode 4 can be insulated effectively from the gate electrode 7.

Note that the gate insulating layer 6 is not limited to a single layer structure, but can be of stacked layer structure including a plurality of layers.

Further, the gate insulating layer 6 can be composed of, for example, inorganic insulating materials such as $SiO_2$. By coating a solution such as polysilicate, polysiloxane, or polysilazane and then heating the coated film under existence of oxygen or water vapor, $SiO_2$ can be obtained from the liquid material. Further, by coating a metal alkoxide solution and then heating it in an oxygen environment, an inorganic insulating material can be obtained (known as the sol-gel process).

The gate electrode 7 can be provided on the gate insulating layer 6. The gate electrode 7 can be composed of, for example, metallic materials such as Pd, Pt, Au, W, Ta, Mo, Al, Cr, Ti, Cu, or alloys including the above, electrically conductive oxides such as ITO, FTO, ATO, $SnO_2$, or the like, carbon materials such as carbon black, carbon nano tube, fullerene, or the like, electrically conductive polymeric materials such as polyacetylene, polypyrrole, polythiophene such as PEDOT (poly-ethylenedioxythiophene), polyaniline, poly(p-phenylene), poly(p-phenylenevinylene), polyfluorene, polycarbazole, polysilane, or derivatives of the above can be cited, and usually used after provided with conductivity by being doped with iron chloride, iodine, strong acid, organic acid, or polymer such as polystyrene sulfonic acid. Further, the above materials can be used alone or in combination.

The thickness (in average) of the gate electrode 7 is not particularly limited, but can be in a range of about 0.1 through 2000 nm, and is preferably in a range of about 1 through 1000 nm.

In the above transistors 1, the amount of current flowing between the source electrode 3 and the drain electrode 4 can be controlled by altering the voltage applied to the gate electrode 7.

Namely, in an OFF state in which no voltage is applied to the gate electrode 7, even if some voltage is applied between the source electrode 3 and the drain electrode 4, very little current flows because very few carriers exist in the organic semiconductor layer 5. In contrast, in an ON state in which substantial voltage is applied to the gate electrode 7, an electrical charge is induced in a part of the organic semiconductor layer 5 facing the gate electrode 7 to form a flow channel for the carrier in the channel region 51. In this condition, if substantial voltage is applied between the source electrode 3 and the drain electrode 4, the current flows through the channel region 51.

The transistor 1 described above can be manufactured as follows, for example.

Two illustrative methods of manufacturing the transistor 1 are hereinafter described.

A first illustrative manufacturing method of the transistor 1 shown in FIGS. 1A and 1B is described.

Each of FIGS. 2A through 2E, and 3A through 3D provides a view (a vertical cross-sectional view) for explaining the first manufacturing method of the transistor shown in FIGS. 1A and 1B. Note that the upper sides of FIGS. 2A through 2E, and 3A through 3D are referred to as "upper side" and the lower sides thereof are referred to as "lower side" in the following descriptions.

The first manufacturing method of the transistor 1 comprises the step of forming the source electrode and the drain electrode, the step of removing organic matter, the step of forming the organic semiconductor layer,] the step of forming the gate insulating layer, and the step of forming the gate electrode. Hereinafter, each of these steps is sequentially described.

Steps of forming the source electrode 3 and the drain electrode 4 using electroless plating processes (the first step) are explained herein. FIGS. 2A through 2D are views for explaining each step of electroless plating.

Firstly, the substrate 2 is provided and then rinsed out. Although it can simply be rinsed out with water, a cleaning process described below may be executed.

In one aspect, the substrate 2 can be made of an organic material (e.g., resin). In another aspect, the electrodes can be formed on one side of the substrate 2. When the substrate is made of the organic material, the surface potential of the substrate 2 is usually negative. The substrate made of glass is also charged negatively.

Figure 2A:
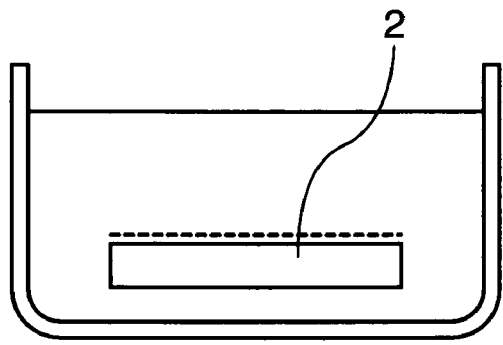
FIGS. 2A through 2E are views (vertical cross-sectional views) for explaining one illustrative manufacturing method of the transistor shown in FIGS. 1A and 1B.

Referring to FIG. 2A, the surface potential of the substrate 2 is set to have a constant negative potential by alkali-cleaning the substrate 2. Specifically, the substrate 2 is dipped in sodium hydrate having concentration of 1 through 10 wt % for about 10 through 60 minutes under room temperature and then rinsed with water. Although the outer most surface layer of the substrate 2 is hydrolyzed to be formed as a hydrolyte layer, the potential of the outer most layer is also negative, and accordingly, is set to be constant by the cleaning process.

Note that the cleaning process and a surface roughening process for the substrate 2 can simultaneously be performed by the alkali-cleaning process described above. Thus, the adhesiveness of the metallic layer (electrode) can be enhanced.

The cleaning process with acids such as hydrochloric acid, nitric acid, or sulfuric acid as well as alkaline aqueous solution is also effective. A combination of the cleaning process using an acid or an alkali and a cleaning process using an organic solvent is also effective for removing contamination from the surface of the substrate in the form of organic matter.

Subsequently, pre-processing for forming a metallic layer 8 is executed on the substrate 2.

Figure 2B:
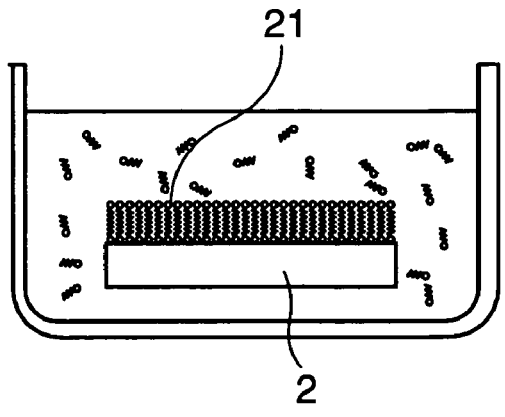

Referring to FIG. 2B, a surfactant 21 is provided on the surface of the substrate 2. The surfactant 21 can be provided on the entire surface of the substrate 2. In one aspect, the surfactant 21 has a property of adhering to the surface of the substrate 2 as positive ions. As the surfactant 21, a cationic surfactant or a surface agent having a property equivalent to the cation surfactant can be used. In a further aspect, the surface potential of the substrate 2 is negative, and accordingly, the negative potential of the substrate 2 can be neutralized or inverted to be a positive potential by using the cationic surfactant. In other words, the surfactant 21 acts as a charge controlling agent. Other than the surfactants, organic materials capable of changing the surface potential by physically or chemically adhering to the surface can be used for the present invention. Note that, by using the surfactants, the surface potential can be adjusted freely without depending on the characteristics of the substrate 2, and further, the surface potential can be set to be constant to form the stable potential surface.

Referring to FIG. 2B, the substrate 2 can be dipped in the surfactant solution 20. Specifically, the substrate 2 is dipped in the cation surfactant solution, which is a kind of alkyl ammonium chloride, for 10 seconds through 5 minutes under room temperature, and then, washed with purified water. Subsequently, the substrate 2 can be sufficiently dried under room temperature.

Subsequently, the patterns of the source electrode 3 and the drain electrode 4 are provided to the substrate 2. For the above, referring to FIG. 2C, the surfactant 21 provided on the surface of the substrate 2 is partially removed. In other words, the surfactant 21 is patterned so as to remain in regions to form the electrodes.

In one aspect, the surface of the substrate 2 is irradiated with vacuum ultraviolet radiation (VUV) 22. The substrate 2 can be irradiated with the vacuum ultraviolet radiation 22 via a photomask 26 disposed between a light source 24 and the substrate 2. The vacuum ultraviolet radiation 22 is blocked by the pattern 29 of the photomask 26 and is transmitted through parts other than the pattern 29. The surfactant 21 is decomposed by the irradiation of the vacuum ultraviolet radiation 22. Alternatively, when using the organic material substrate, the outer most surface layer of the substrate 2 is decomposed to be removed from the substrate 2 together with the surfactant 21. The vacuum ultraviolet 22 causes the decomposition of the surfactant 21 or the substrate 2 described above by cutting the interatomic bond thereof.

Note that, in certain aspects, the regions (non-irradiated sections 27) with the surfactant 21 remaining are regions on which the metallic layer (electrode) is formed, and have predetermined patterned shapes. The regions (irradiated sections 28) from which the surfactant 21 has been removed by the irradiation of the vacuum ultraviolet radiation 22 have inverted shapes of the electrode regions.

The wavelength of the vacuum ultraviolet radiation 22 can be in a range of 100 nm through 200 nm (more preferably, in a range of 100 nm through 180 nm). The vacuum ultraviolet radiation 22 has enough energy (wavelength) to break the interatomic bond of the organic materials. The vacuum ultraviolet radiation 22 needs to have energy (wavelength) capable at least of breaking C=C bond. It can have energy (wavelength) capable of breaking each interatomic bond (at least one of C—C, C=C, C—F, C—H, C—Cl, C—N, C—O, N—H, and O—H bonding) of the surfactant 21 or the substrate 2. An excimer lamp filled with Xe gas can be used as the light source 24 (wavelength of 172 nm). By using the lamp, the resonator and the optical system for generating a laser beam and scanning time can be eliminated, thus simplifying the manufacturing process.

Figure 2C:
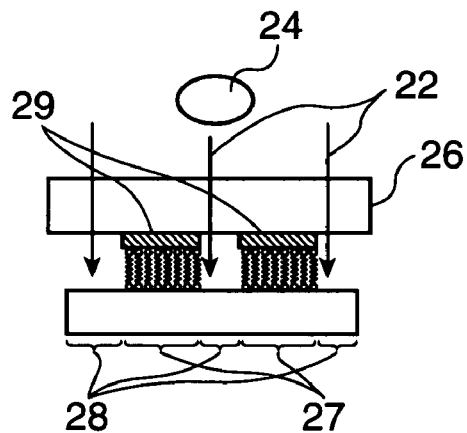

Specifically, referring to FIG. 2C, the photomask 26 is disposed on the surface of the substrate 2 on which the wiring is to be formed. The photomask 26 can be a metal mask. For example, as the photomask 26, high-purity quartz glass for the vacuum ultraviolet radiation (The transmission factor for the vacuum ultraviolet radiation is not less than 80%.) with pattern 29 of the chromium formed thereon is used. Although the photomask 26 is disposed above the substrate 2 with a space therebetween in FIG. 2C, the photomask 26 is practically disposed directly on the substrate 2. The light source 24, the photomask 26 and the substrate 2 can be disposed in a nitrogen atmosphere. In the nitrogen atmosphere, the vacuum ultraviolet radiation 22 can reach as far as about 10 mm without attenuation. In case the elasticity and curve inherent in the substrate 2 prevent the substrate 2 and the photomask 26 from evenly contacting each other, the periphery of the photomask 26 can be held by a holder, and the substrate 2 can be pressed against photomask 26 from behind in the area equivalent to the size of the photomask 26. Alternatively, both of the photomask 26 and the substrate 2 can be effectively adhered by discharging the gas from the gap between the substrate 2 and the photomask 26 using a vacuum pump. The light source 24 is placed as close as possible to the substrate 2 (e.g., no greater than 10 mm). As the light source 24, for example, an excimer VUV/03 cleaning equipment (produced by USHIO Inc., model: UER20-172A/B, lamp specification: dielectric barrier discharge excimer lamp filled with Xe gas) can be used. When the substrate 2 is made of polyimide, irradiation with the output power of about 10 mW is executed for about 10 minutes.

Although the above description explains that the vacuum ultraviolet radiation 22 irradiates in nitrogen atmosphere, any gases other than nitrogen which do not absorb the light of the above wavelength range can be utilized as the atmosphere. For example, inactive gases such as Ar or He are effective. Further, it is also certainly effective that the light source 24 is used in a vacuum.

After irradiating with the vacuum ultraviolet radiation 22, the cleaning process (e.g., a wet cleaning process) can be executed for the substrate 2. As described above, decomposition products of the substrate 2 or the surfactant 21 are removed. As the method of cleaning, the substrate 2 can be dipped in the cleaning fluid, or the cleaning fluid can be sprayed to the substrate 2 as a shower. Alkali solution (strong alkali solution or weak alkali solution) or purified water can be used as the cleaning fluid. As the shower method, purified water shower cleaning or high-pressure jet purified water cleaning can be adopted. Supersonic vibration can be added to the cleaning process. After the cleaning process, the surfactant 21 remains in the non-irradiated sections 27, and the surfactant 21 is removed from the irradiated sections 28 exposing the surface of the substrate 2.

As the cationic surfactant, for example, alkyl ammonium chloride, benzalkonium chloride, benzethonium chloride, and stearic acid can be cited, and one or more of these agents can be used alone or in combination.

The temperature of the surface-active solution in use can be in a range of about 0 through 70° C., and preferably in a range of about 10 through 40° C.

Further, the process time of the substrate 2 in the surface-active solution can be in a range of about 10 through 90 seconds, and preferably in a range of about 30 through 60 seconds.

Figure 2D:
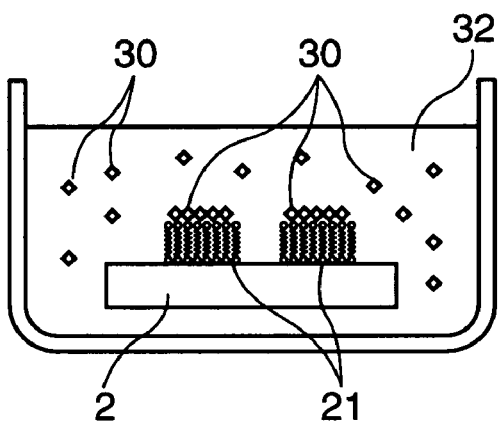

Subsequently, the catalytic agent can be attached on the surface of the substrate 2. Referring to FIG. 2D, the catalytic agent (plating catalytic agent) 30 is selectively attached to the sections with the surfactant 21 remaining, namely to the non-irradiated sections 27. The catalytic agent 30 such as palladium (Pd) can be used for inducing precipitation of the metallic layer (plating layer) in the electroless plating solution. Pt, Ni, Cu, and Au offer similar catalytic actions. In the example shown in FIG. 2D, the substrate 2 is dipped in the catalytic agent fluid 32 including tin-palladium. Specifically, the substrate 2 can be dipped in the tin-palladium colloidal suspension of about PH 1 at room temperature for 30 seconds though 3 minutes, followed by sufficiently rinsing with water. The tin-palladium colloidal particles are negatively charged, and selectively attached to the non-irradiated sections 27 having the surfactant 21 (the cationic surfactant) remaining thereon and charged positively. Since the irradiated sections 28 can be charged similarly to the substrate 2, namely charged negatively, the tin-palladium colloidal particles charged negatively do not attach thereto. Subsequently, the substrate 2 is dipped in acidic solution for activating the catalytic agent. By such treatment, the tin colloidal particles can be removed to deposit palladium alone on the non-irradiated sections 27.

As the acidic solution, for example, a solution including an acid such as $HBF_4$ and a reducing agent such as glucose, or a solution made by adding sulfuric acid to the aforementioned solution can be used.

The temperature of the solution including the catalytic agent in use can be in a range of about 0 through 70° C., and preferably in a range of about 10 through 40° C.

The process time of the substrate 2 in the solution including the catalytic agent can be in a range of about 10 seconds through 5 minutes, and preferably in a range of about 20 seconds through 3 minutes.

Meanwhile, the temperature of the acidic solution in use can be in a range of about 0 through 70° C., and preferably in a range of about 10 through 40° C.

The process time of the substrate 2 in the acidic solution can be in a range of about 10 seconds through 5 minutes, and preferably in a range of about 30 seconds through 3 minutes.

The substrate 2, to which the catalytic agent is thus attached (absorbed), is cleaned using, for example, purified water (ultra pure water), ion exchanged water, distilled water, or RO water.

Figure 2E:
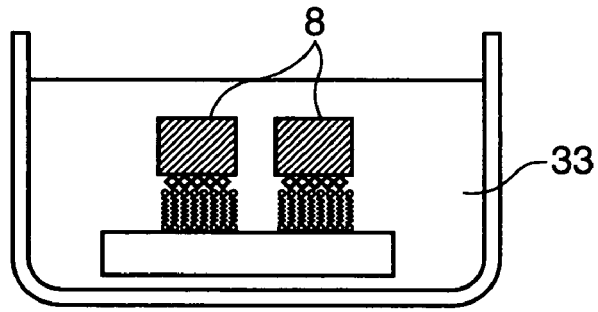

Referring to FIG. 2E, the exposed substrate 2 is dipped in plating solution 33 to form the source electrode 3 and the drain electrode 4 (the metallic layer 8) using the catalytic agent 30 as a core. Since the catalytic agent 30 is formed on the surfactant 21 of the non-irradiated sections 27, the metallic layer 8 is selectively deposited only on these sections to form the source electrode 3 and the drain electrode 4. The metallic layer 8 can be formed of a single layer, or be formed of multiple layers. Although the materials of the metallic layer are not particularly limited, for example, alloys such as Ni+Au, Cu, Ni+Cu, or Ni+Au+Cu can also be used in addition to the metals such as Ni or Au mentioned above.

In the embodiment shown in FIG. 2E, the substrate 2 is dipped in the plating solution 33 (80° C. in temperature) composed mainly of nickel sulfate hexahydrate for about 15 seconds through 3 minutes to form a nickel layer of about 20 nm through 200 nm in thickness. Alternatively, plating solution (60° C. in temperature) composed mainly of nickel chloride hexahydrate can be used to form the nickel layer.

Incidentally, as the plating solution 33 used for electroless plating, those including a metallic salt of the metal for forming the metallic layer 8 (the source electrode 3 and the drain electrode 4) and the reducing agent, but not substantially including any alkali metal ions can be used.

Namely, when preparing the plating solution 33 by resolving at least the metallic salt and the reducing agent into the solvent, those not including alkali metal as their composing elements can be used as the material.

Thus, the alkali metal ions can be prevented from being mixed into the metallic layer 8 to be formed. As a result, the alkali metal ions can be prevented from being diffused (mixed) into the organic semiconductor layer 5 to be formed in the following step to prevent the performance of the organic semiconductor layer 5 from deteriorating.

As the metallic salt, for example, sulfate salt, nitrate salt, or the like can be used.

As the reducing agent, for example, hydrazine, ammonium hypophosphite, and so on can be cited. Among these agents, those composed mainly of at least one of hydrazine and ammonium hypophosphite are more preferable. By using these materials as the reducing agent under appropriate plating solution temperature and appropriate plating solution pH, the speed of forming the metallic layer 8 is made proper, which makes it easy to control the thickness of the film within the optimum range of the film thickness required for the source electrode 3 and the drain electrode 4. Further, the resulting metallic layer 8 can also have an even thickness and preferable surface property (high film surface morphology).

The amount of the metallic salt included in the plating solution 33 (the amount of the metallic salt added to the solvent) can be in a range of about 1 through 50 g/L, and preferably in a range of about 5 through 25 g/L. If the content of the metallic salt is too small, it may take a long time to form the metallic layer 8. In contrast, if the content of the metallic salt is increased beyond the upper limit described above, the effectiveness is not expected to be increased.

Further, the amount of the reducing agent included in the plating solution 33 (the amount of the reducing agent added to the solvent) can be in a range of about 10 through 200 g/L, and preferably in a range of about 50 through 150 g/L. If the amount of the reducing agent is too small, it may be difficult to efficiently reduce the metallic ions depending on the nature of the reducing agent. In contrast, if the content of the reducing agent is increased beyond the upper limit described above, the effectiveness is not expected to be increased.

It is preferable that a pH adjuster (a pH buffer) is further mixed (added) to such a plating solution 33. According to the above, it is prevented or controlled that the pH of the plating solution 33 is lowered as electroless plating proceeds, and as a result, slow-down of the deposition rate or changes in composition or characteristics of the metallic layer 8 can effectively be prevented.

As such a pH adjuster, various kinds can be cited. Those composed mainly of at least one of ammonia water, trimethyl ammonium hydride, and ammonium sulfide are preferable. Since these materials excel in buffering behavior, the aforementioned effect is remarkably exerted by using these materials as the pH adjustor.

By dipping the substrate 2 having the catalytic agent attached thereto into the plating solution 33 described above, the electroless plating reaction is promoted with the nucleate catalytic agent, thus forming the metallic layer 8.

The pH of the plating solution 33 in use can be in a range of about 5 through 12, and preferably in a range of about 6 through 10.

The temperature of the plating solution 33 in use can be in a range of about 30 through 90° C., and preferably in a range of about 40 through 80° C.

The process time of the substrate 2 in the plating solution 33 can be in a range of about 10 seconds through 5 minutes, and preferably in a range of about 20 seconds through 3 minutes.

If the pH and the temperature of the plating solution 33 and the process time by the plating solution 33 are arranged within the ranges mentioned above, the deposition rate becomes especially proper, and accordingly the metallic layer 8 having an even thickness can be formed with high precision.

Note that the thickness of the metallic layer 8 to be formed can be controlled by arranging the plating conditions such as the operation temperature (the temperature of the plating solution), the operation time (the plating time), the amount of the plating solution, the pH of the plating solution, or the number of plating processes (the number of turns).

Further, some additives such as a complexing agent or a stabilizing agent can be added in the plating solution 33 if necessary.

As the complexing agent, for example, carboxylic acid such as ethylenediamine tetra acetic acid or acetic acid, oxycarboxylic acid such as tartaric acid or citric acid, aminocarboxylic acid such as glycine, amine such as triethanolamine, and multiple alcohols such as glycerin or sorbitol can be cited.

As the stabilizing agent, for example, 2,2'-bipyridyl, cyanide, ferrocyanide, phenanthroline, thiourea, mercapt benzothiazole, and thioglycolic acid can be cited.

The substrate 2 on which the metallic layer 8 is thus formed is cleaned using, for example, purified water (ultra pure water), ion exchanged water, distilled water, or RO water.

According to the present illustrative aspect, the surfactant 21 is patterned by irradiation of the vacuum ultraviolet radiation 22, and then the catalytic agent 30 is formed on the surfactant 21. Thus, the metallic layer 8 can be deposited so as to have the shapes of the source electrode 3 and the drain electrode 4. Accordingly, without forming the mask by, for example, a resist layer, the wiring can precisely be formed in low cost with reduced waste of materials by a simple and short-duration manufacturing process.

Subsequently, in the step of removing organic matter, the substrate 2 having the source electrode 3 and the drain electrode 4 formed thereon is cleaned using, for example, water (purified water or the like) and/or organic solvents alone or in combination.

Figure 3A:
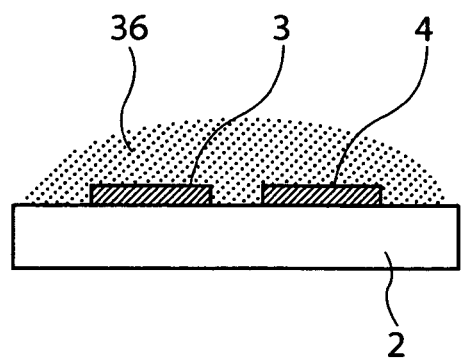
FIGS. 3A through 3D are views (vertical cross-sectional views) for explaining the illustrative manufacturing method of the transistor shown in FIGS. 1A and 1B.

And then, as shown in FIG. 3A, any organic matter existing on the surface of the substrate 2 on which the organic semiconductor layer 5 is to be formed can be removed. Thus, the barrier for the carrier in the interface between the organic semiconductor layer 5 and the source electrode 3 and the drain electrode 4 can be removed to improve the characteristics of the transistor 1.

As the method (the removing method) of removing organic matter, for example, a plasma process, a process with ozone water, etching with an acid or an alkali, mechanical removal of the surface layer, and UV (in particular, deep UV) radiation can be cited, and one or more of these processes can be used alone or in combination. Among these processes, the plasma process is preferable as the method of removing organic matter. According to the plasma process, organic matter can reliably be removed in a short period of time.

When executing the plasma process, the substrate 2 is placed in a chamber equipped with a decompression means and a plasma generation means, and can be processed by generating plasma 36 in the chamber in a decompressed condition, or by ejecting plasma against the surface of the substrate from a head equipped with a plasma ejection nozzle.

According to the latter method, since the plasma process can be executed at atmospheric pressure, the chamber and the decompression means can be omitted to provide advantages of low manufacturing cost and short turn around time in manufacturing.

When performing the plasma process at atmospheric pressure, for example, the gas flow rate is in a range of about 10 through 300 sccm, and the RF power is in a range of about 0.01 through 0.1 W/cm$^2$.

The gas used for generating plasma is not particularly limited, but gases composed mainly of at least one of oxygen, nitrogen, argon, helium, and fluorocarbon are preferable. Since plasma can be generated in low vacuum atmosphere or under the atmospheric pressure by mixing argon or helium with the main component, the equipment can be simplified.

Note that the above described step of removing organic matter can be omitted as appropriate.

Figure 3B:
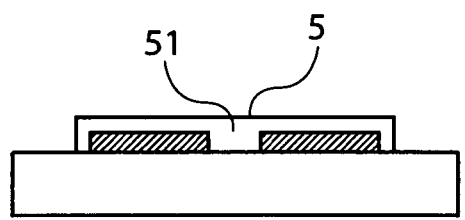

Then in a step of forming an organic semiconductor layer (the second step), as shown in FIG. 3B, the organic semiconductor layer 5 is formed on the substrate 2 having the source electrode 3 and the drain electrode 4 formed thereon using a coating method so as to cover the source electrode 3 and drain electrode 4.

In this case, the channel region 51 is formed between the source electrode 3 and the drain electrode 4 (an area corresponding to the gate electrode 7).

Specifically, the organic semiconductor layer 5 can be formed by coating the substrate 2 with a solution including an organic polymeric material or a precursor thereof so as to cover the source electrode 3 and the drain electrode 4, and then executing a post-process (e.g., heating, radiating with an infrared ray, or providing an ultrasonic ray) on the coating film as appropriate.

Note that, as a coating method, for example, a spin coating method, a casting method, a micro gravure coating method, a gravure coating method, a bar coating method, a roller coating method, a wire bar coating method, a dip coating method, a spray coating method, a screen printing method, a flexographic printing method, an offset printing method, an inkjet printing method, a micro-contact printing method, and so on can be cited, and one or more of these methods can be used alone or in combination.

Note that the area in which the organic semiconductor layer 5 is formed is not limited to the structure shown in the drawings, and the organic semiconductor layer 5 can be formed only in the area (the channel region 51) defined between the source electrode 3 and the drain electrode 4. According to this structure, when a plurality of transistors (element) are arranged on a single substrate, the organic semiconductor layer 5 for each element can separately be formed to reduce leak current and crosstalk between each of the elements. Further, the amount of the organic semiconductor material used can be reduced, thus reducing the manufacturing cost. When the organic semiconductor 5 is formed only in the channel region 51, the inkjet method, which can be executed in a non-contact manner, is particularly suitable. Further, the required resolution of 5 through 100 μm matches the resolution of the inkjet method.

In this case of dissolving the organic semiconductor materials, as the solvent, for example, inorganic solvents such as nitric acid, sulfuric acid, ammonia, hydrogen peroxide, water, carbon disulfide, carbon tetrachloride, or ethylene carbonate, various organic solvent including ketones such as methyl ethyl ketone (MEK), acetone, diethyl ketone, methyl isopropyl ketone (MIPK), or cyclohexanon, alcohol solvents such as methanol, ethanol, isopropanol, ethylene glycol, diethylene glycol (DEG), or glycerine, ethers such as diethyl ether, diisopropyl ether, 1,2-dimetoxy ethane (DME), 1,4-dioxane, tetrahydrofuran (THF), tetrahydropyran (THP), anisole, diethylene glycol dimethyl ether (diglyme), or diethylene glycol ethyl ether (carbitol), cellosolve™ solvent such as methyl cellosolve, ethyl cellosolve, or phenyl cellosolve, aliphatic hydrocarbon solvents such as hexane, pentane, heptane, or cyclohexane, aromatic hydrocarbon solvents such as toluene, xylene, or benzene, heteroaromatic solvent such as pyridine, pyrazine, furan, pyrrole, thiophene, or methylpyrrolidone, amide solvent such as N,N-dimethylformamide (DMF) or N,N-dimethylacetamide (DMA), halogenated compound solvents such as dichloromethane, chloroform, or 1,2-dichloroethane, ester solvents such as ethyl acetate, methyl acetate, or ethyl formate, sulfur compound solvents such as dimethyl sulfoxide (DMSO) or sulfolane, nitrile solvents such as acetonitrile, propionitrile, or acrylonitrile, organic acid solvents such as formic acid, acetic acid, trichloroacetic acid, or trifluoroacetic acid, or mixed solvents including the above can be cited.

Since the organic semiconductor includes a conjugated system such as an aromatic hydrocarbon group or a heterocyclic group, it generally dissolves easily with the aromatic hydrocarbon solvents. Toluene, xylene, trimethyl benzene, tetramethyl benzene, cyclohexyl benzene, and so on are particularly suitable solvents.

Figure 3C:
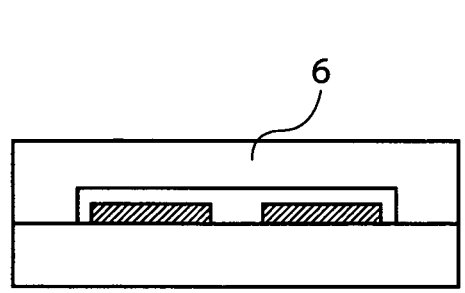

Subsequently, in a step of forming a gate insulating layer (the third step) as shown in FIG. 3C, the gate insulating layer 6 is formed on the organic semiconductor layer 5 using a coating method.

Specifically, the gate insulating layer 6 can be formed by coating the organic semiconductor layer 5 with a solution including an insulating material or a precursor thereof, and then executing a post-process (e.g., heating, radiating with an infrared ray, or providing an ultrasonic ray) on the coating film as appropriate.

Further, the same method as above can be used as the coating method. When the organic semiconductor layer 5 is composed of a soluble organic semiconductor material, a solvent with which the organic semiconductor layer 5 is not swollen nor dissolved should be selected as the solvent for the insulating material. As described above, since the organic semiconductor materials dissolve easily with the aromatic hydrocarbon solvents, it is preferable to avoid such solvents when coating the insulating materials. Namely, water like solvents, alcohol solvents, ketones, ethers, ester solvents, aliphatic hydrocarbon solvents, or fluorinated solvents are preferably used.

Figure 3D:
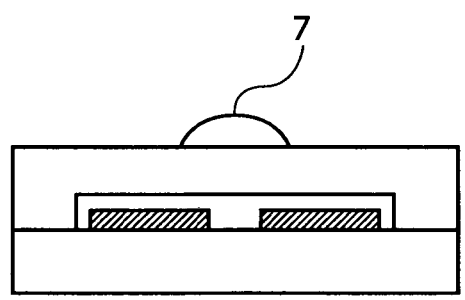

Subsequently, in a step of forming a gate electrode (the fourth step) as shown in FIG. 3D, the gate electrode 7 is formed on the gate insulating layer 6 using a coating method. The gate electrode 7 is formed so as to cover the channel region 51.

Specifically, the gate electrode 7 can be formed by coating the gate insulating layer 6 with a solution including an electrically conductive material (an electrode material) or a precursor thereof, and then executing a post-process (e.g., heating, radiating with an infrared ray, or providing an ultrasonic ray) on the coating film as appropriate.

Further, although the same method as described above can be used as the coating method, the inkjet method preferable. According to the inkjet method, the gate electrode 7 having a predetermined shape can easily and reliably be formed.

A method of forming the gate electrode 7 using the inkjet method is hereinafter described.

In the inkjet method, patterning is executed by ejecting droplets of solution including an electrically conductive material or the precursor thereof (hereinafter referred to as "ink") from a nozzle of a droplet ejection head.

Note that the viscosity (at room temperature) of the ink is not particularly limited, but can be in a range of about 1 through 20 cps, in general, and more preferably in a range of about 3 through 10 cps. If the viscosity of the ink is arranged in the range mentioned above, the droplets can more stably be ejected from the nozzle.

Further, the volume (in average) of an ink droplet is not particularly limited, but can be in a range of about 0.1 through 40 pL in general, and preferably in a range of about 1 through 30 pL. By arranging the volume (in average) of a single droplet in the range mentioned above, more precise shapes can be formed.

Materials as described below, for example, can be used for the ink.

When the gate electrode 7 is composed with an organic polymeric material, a solution dissolving the organic polymeric material is used as the ink.

In this case, as the solvent, for example, inorganic solvent such as nitric acid, sulfuric acid, ammonia, hydrogen peroxide, water, carbon disulfide, carbon tetrachloride, or ethylene carbonate, various organic solvent including ketones such as methyl ethyl ketone (MEK), acetone, diethyl ketone, methyl isopropyl ketone (MIPK), or cyclohexanon, alcohol solvents such as methanol, ethanol, isopropanol, ethylene glycol, diethylene glycol (DEG), or glycerine, ethers such as diethyl ether, diisopropyl ether, 1,2-dimetoxy ethane (DME), 1,4-dioxane, tetrahydrofuran (THF), tetrahydropyran (THP), anisole, diethylene glycol dimethyl ether (diglyme), or diethylene glycol ethyl ether (carbitol), cellosolve™ solvents such as methyl cellosolve, ethyl cellosolve, or phenyl cellosolve, aliphatic hydrocarbon solvents such as hexane, pentane, heptane, or cyclohexane, aromatic hydrocarbon solvents such as toluene, xylene, or benzene, heteroaromatic solvent such as pyridine, pyrazine, furan, pyrrole, thiophene, or methylpyrrolidone, amide solvent such as N,N-dimethylformamide (DMF) or N,N-dimethylacetamide (DMA), halogenated compound solvents such as dichloromethane, chloroform, or 1,2-dichloroethane, ester solvents such as ethyl acetate, methyl acetate, or ethyl formate, sulfur compound solvents such as dimethyl sulfoxide (DMSO) or sulfolane, nitrile solvents such as acetonitrile, propionitrile, or acrylonitrile, organic acid solvents such as formic acid, acetic acid, trichloroacetic acid, or trifluoroacetic acid, or mixed solvents including the above can be cited.

If the gate electrode 7 is composed of an inorganic material, dispersion liquid including particles of the inorganic material can be used as the ink. The metallic colloids are included therein. When the dispersion liquid including metals such as Au, Pt, Pd, Ag, or Cu dispersed in the dispersion medium is coated and then heated at the temperature in a range of 80 through 400° C., high electrical conductivity can be obtained.

In this case, the content of the particles of the inorganic material in the ink is not particularly limited, but can be in a range of about 1 through 40 wt %, and preferably in a range of about 10 through 30 wt %.

Further, the average particle diameter of the inorganic material particles is not particularly limited, but can be in a range of about 1 through 100 nm, and is preferably in a range of about 2 through 30 nm.

Further, particles coated with a coagulation inhibition agent (a dispersing agent) for inhibiting coagulation in room temperature can be used for the inorganic material particles. As the coagulation inhibition agent, for example, compounds having a group including a nitrogen atom such as alkylamine, compounds having a group including an oxygen atom such as alkanediol, and compounds having a group including a sulfur atom such as alkylthiol or alkanethiol can be cited.

In this case, a remover capable of removing the coagulation inhibition agent by a predetermined process (e.g., heating or the like) is added into the ink. As the remover, for example, various carbonic acids including straight type or branched type of saturated carbonic acids with a carbon number of 1 through 10 such as formic acid, acetic acid, proponic acid, butanoic acid, hexanoic acid, or octylic acid, unsaturated carbonic acids such as acrylic acid, methacrylic acid, crotonic acid, cinnamic acid, benzoic acid, or sorbic acid, dibasic acids such as oxalic acid, malonic acid, sebacic acid, maleic acid, fumaric acid, or itaconic acid, organic acids including various phosphoric acids and various sulfonic acids substituting the carboxyl groups of the above carbonic acids with phosphate groups or sulfonyl groups, esters derived from the above organic acids, aromatic acid anhydrides such as phthalic anhydride, trimellitic anhydride, pyromellitic dianhydride, benzophenone tetracarboxylic dianhydride, ethylene glycol bis(anhydro trimelitate), or glycerol tris(anhydro trimelitate), cyclic fatty acid anhydrides such as maleic anhydride, succinic anhydride, tetrahydrophtharic anhydride, methyltetrahydrophtharic anhydride, methyl nadic anhydride, alkenyl succinic anhydride, hexahydro phthalic anhydride, methylhexahydro phthalic anhydride, or methylsyclohexene tetracarboxylic dianhydride, fatty acid anhydrides such as polyadipic anhydride, polyazelaic anhydride, or polysebacic anhydride can be cited.

As the dispersion medium, for example, terpineol, mineral spirit, xylene, toluene, ethyl benzene, mesitylene, hexane, heptane, octane, decane, dodecane, cyclohexane, cyclooctane, ethanol, isopropanol (IPA), water, or mixed fluid including the above can be used.

Further, precursors of various thermoset resins such as phenol resin, epoxy resin, unsaturated polyester resin, vinylester resin, diallyl phthalate resin, oligoester acrylate resin, xylene resin, bismaleimide triazine resin, furan resin, urea resin, polyurethane resin, melamine resin, silicone resin can be added into (mixed with) the ink.

Note that the viscosity of the ink can be controlled by, for example, arranging the content of the inorganic material particles, the nature or the composition of the dispersion medium, or presence or absence or the nature of the additives.

When forming the gate electrode 7 with a metallic material, dispersion liquid including a reducing agent and metal oxide particles composed of metal oxide that becomes a metal material by being reduced can be used as the ink.

In this case, the content of the particles of the metal oxide in the ink is not particularly limited, but can be in a range of about 1 through 40 wt %, and preferably in a range of about 10 through 30 wt %.

Further, the average particle diameter of the metal oxide particles is not particularly limited, but can be no greater than 100 nm, and is preferably no greater than 30 nm.

Further, as the reducing agent, for example, ascorbic acid, hydrogen sulfide, oxalic acid, and carbon monoxide can be cited.

As the dispersion medium, for example, low viscosity oils such as butyl cellosolve or polyethylene glycol, alcohols such as 2-propanol, or mixed fluid including the above can be used.

Note that the viscosity of the ink can be controlled by, for example, arranging the content of the metal oxide particles, the nature or the composition of the dispersion medium.

If the gate electrode 7 is composed of metal oxide, a solution including the precursor of the metal oxide can be used as the ink.

As the precursor of the metal oxide to be used, for example, organic metallic compounds such as metal alkoxide or metallic salt of acetic acid or acetic acid derivatives, inorganic metallic compounds such as a metallic chloride, a metallic sulfide, or a metallic cyanide can be cited, and one or more of these precursors can be used alone or in combination.

The concentration (content) of the precursor of the metal oxide in the ink is not particularly limited, but can be in a range of about 1 through 50 wt %, and preferably in a range of about 10 through 30 wt %.

Further, as the solvent, for example, water, polyhydric alcohols such as ethylene glycol, glycerine, diethylene glycol, or triethanolamine, or monoalcohols such as methanol, ethanol, isopropanol, butanol, allyl alcohol, furfuryl alcohol, ethylene glycol monoacetate, or mixed fluid including the above can be used.

Note that the viscosity of the ink can be controlled by, for example, arranging the concentration of the precursor of the metal oxide, the nature or the composition of the solvent.

After going through the steps described above, the transistor 1 shown in FIGS. 1A and 1B can be obtained.

In such a manufacturing method, since the electroless plating process is used as the method of forming the source electrode 3 and the drain electrode 4 while each of the organic semiconductor layer 5, the gate insulating layer 6, and the gate electrode 7 is formed using the coating method, large-scale equipment such as a vacuum equipment are not required, Thus the transistor 1 can be manufactured by simple processes at a lower cost.

Further, by using the electroless plating process as the method of forming the source electrode 3 and the drain electrode 4, these electrodes can be formed with high dimensional accuracy, thus the transistor 1 can be of superior characteristics (switching characteristics).

Further, by using the plating solution substantially free of any alkali metallic ions as the plating solution 33 used for the electroless plating process, interfusion of the alkali metallic ions to the source electrode 3 and the drain electrode 4 can be prevented, thus preventing the alkali metallic ions from diffusing into the organic semiconductor layer 5. Thus, the characteristics of the organic semiconductor layer 5 can be prevented from deteriorating, and as a result, a switching element in the form of a transistor 1 having superior characteristics can be manufactured.

Further, by providing the step of removing organic matter described in the second step above, the characteristics of the transistor 1 can be further enhanced.

Still further, by using the atmospheric pressure plasma as the method of removing organic matter in second step above, and by using the wet-etching process as the method of removing the metallic layer 8 in the third step above, it is possible to execute all of the manufacturing steps of the transistor 1 under atmospheric pressure, thus reducing the manufacturing cost as well as the manufacturing time.

FIGS. 4A through 4D are schematic views for explaining a second illustrative manufacturing method (a second embodiment of the method of manufacturing a transistor according to the present invention) of the transistor 1 shown in FIGS. 1A and 1B. In the present embodiment, a part of the first manufacturing method, namely, patterning of the surfactant 21 and the catalytic agent 30 attaching process in the process of forming the source electrode and the drain electrode are respectively replaced with the steps described below. Otherwise, the present embodiment is substantially the same as the above embodiment except as described below.

The substrate 2 has already been provided with the charge control agent (surfactant) attached thereto.

There is no substantial difference from the exposure process in described above in the first illustrative embodiment, as the surfactant 21 is partially removed by irradiation with light. The surfactant 21 on the substrate 2 is irradiated with the vacuum ultraviolet radiation 22 discharged from the light source 24 via the photomask 26a. Since the light blocking pattern 29a of the photomask 26a blocks the vacuum ultraviolet radiation 22, the surfactant 21 in the irradiated sections 28a is decomposed while the surfactant 21 in the non-irradiated sections 27a remains. As described above, patterning the surfactant 21 in the present illustrative embodiment is not different from the first illustrative embodiment described above. What is different is that the metallic layer 8 is deposited on the non-irradiated sections 27 to form the source electrode 3 and the drain electrode 4 in the first illustrative embodiment, while the metallic layer 8 is formed on the irradiated sections 28a with no surfactant in the present illustrative embodiment. Accordingly, the pattern of the photomask 26a is arranged so that the source electrode 3 and the drain electrode 4 (the metallic layer 8) correspond to the irradiated sections 28a. In other words, the light blocking pattern 29a is arranged so that the vacuum ultraviolet radiation 22 is transmitted through the regions on the photomask 26a corresponding to the source electrode 3 or the drain electrode 4, and the surfactant 21 of those regions is decomposed to be removed from the substrate 2.

Figure 4A:
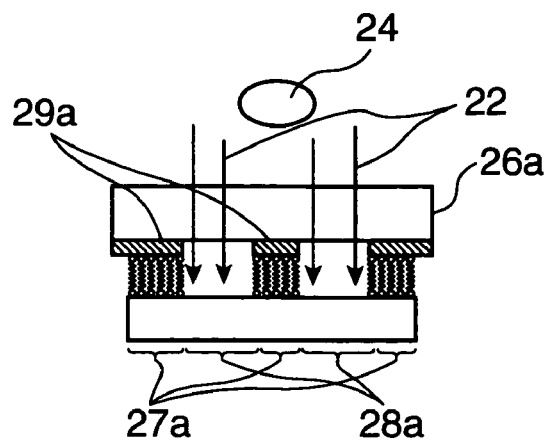
FIGS. 4A through 4D are views (vertical cross-sectional views) for explaining another illustrative manufacturing method of the transistor shown in FIGS. 1A and 1B.
Figure 4B:
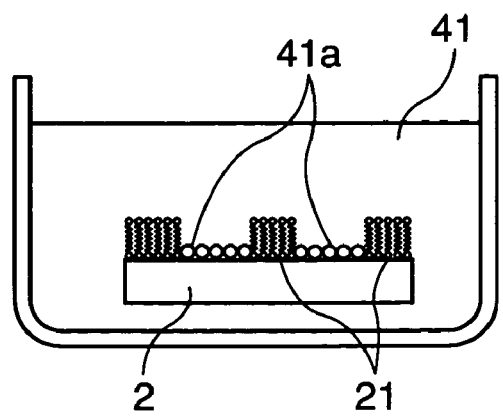
Figure 4C:
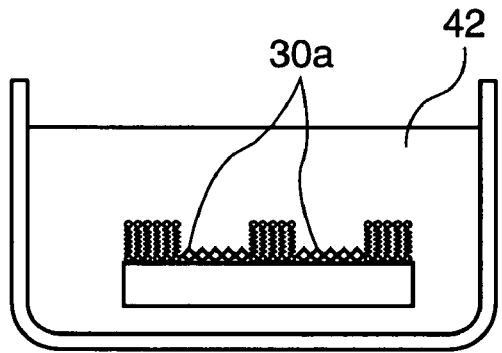
Figure 4D:
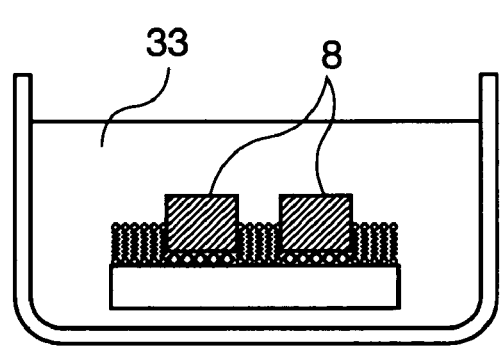

The substrate 2 irradiated with the vacuum ultraviolet radiation 22 is dipped in catalytic agent pre-processing fluid 41 shown in FIG. 4B, and then dipped in a catalytic agent fluid 42 shown in FIG. 4C. As the catalytic agent pre-processing fluid 41, tin chloride(II) aqueous solution or tin chloride(II) dispersion liquid can be used. Further, as the catalytic agent fluid 42, palladium salt aqueous solution, such as palladium chloride aqueous solution can be used. By the above sequence, the catalytic agent 30 formed on the irradiated sections 28 can be charged negatively.

In the catalytic agent pre-processing fluid 41, since the tin chloride is positively charged in the tin chloride(II) aqueous solution, the tin chloride is attached to the negatively charged region of the substrate, the irradiated sections 28a here. And, in the catalytic agent fluid 42, palladium chloride is reduced (changed from $Sn^{2+}$ to $Sn^{4+}$) by tin chloride absorbed by glass, thus forming palladium on the glass surface.

When the substrate 2 with the catalytic agent 30 thus selectively attached to the irradiated sections 28a thereof is dipped in the plating fluid 33, the metallic layer 8 is deposited on the irradiated sections 28a, thus forming the source electrode 3 and the drain electrode 4. Further, the semiconductor layer 5, the gate insulation layer 6, and the gate electrode 7 are formed to complete the transistor 1.

Hereinafter, a second illustrative configuration of a transistor according to the present invention is described.

Figure 5A:
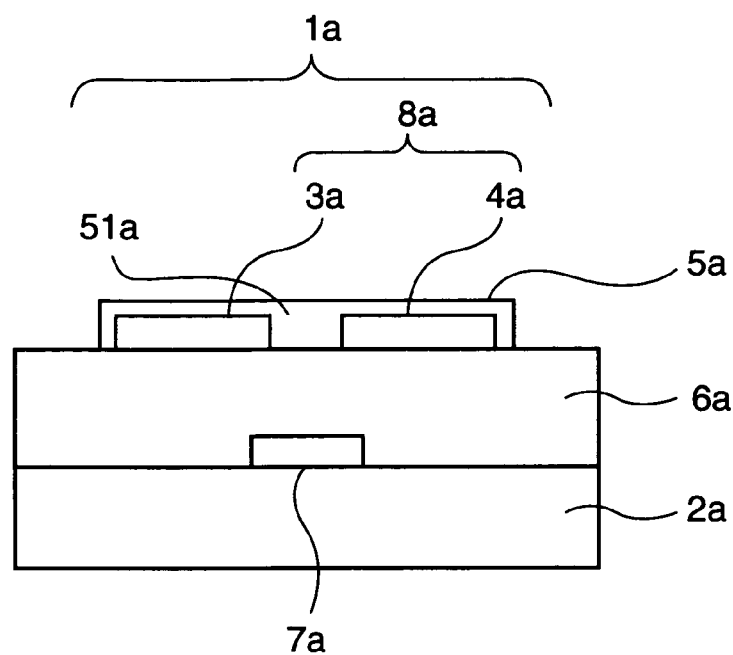
Figure 5B:
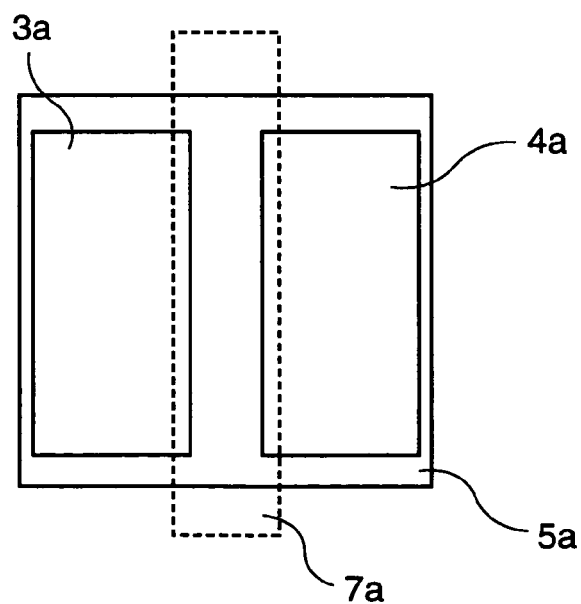

FIGS. 5A and 5B are views showing the second illustrative configuration of the transistor, in which FIG. 5A is a vertical cross-sectional view, and FIG. 5B is a plan view. Note that the upper portion of FIG. 5A is referred to as the "upper side" and the lower portion thereof is referred to as "lower side" in the following descriptions for the sake of simplicity.

Hereinafter, the second illustrative configuration of the transistor and manufacturing method thereof is described focusing mainly on the differences from the first configuration and the first and second manufacturing methods described above, and the description regarding common matters are omitted.

The structure shown in FIGS. 1A and 1B is atop-gate structure in which the gate electrode 7 is positioned above the source electrode 3 or the drain electrode 4 while the structure of the transistor 1a of the present illustrative embodiment is, as shown in FIGS. 5A and 5B, a bottom-gate structure in which the gate electrode 7a is positioned below the source electrode 3a or the drain electrode 4a. Accordingly, the gate electrode 7a is formed substantially on the substrate 2a. Note that "substantially" here means that a sealing layer or a buffer layer is assumed to be a part of the substrate, and the gate electrode 7a is formed not only on the substrate itself as the original material, but also on such additional layers. The gate insulation layer 6a is stacked on the gate electrode 7a. The gate insulation layer 6a is provided so that the gate electrode 7a is electrically insulated at least from the other electrodes 3a and 4a. It can be a patterned thin film or a continuous film. The source electrode 3a and the drain electrode 4a are formed on the gate insulation layer 6a with a gap as long as the channel length L. The channel section is disposed so as to overlap with the gate electrode 7a. And, the organic semiconductor layer 5a is formed so as to cover at least the channel section.

FIGS. 6A through 6D show a second illustrative structure of the transistor and illustrative manufacturing processes of the bottom-gate structure.

The gate electrode forming process will be described. Referring to FIG. 6A, in order to form the gate electrode in the plating fluid 33*a*, the following steps will be executed.

The substrate is cleaned by purified water, alkali solution, or acid solution not only to remove organic matter contamination from the surface, but also to distribute negative charge to the surface evenly.

Next the surfactant is attached to the surface of the substrate as a charge control agent.

Thereafter, while the photomask is adhered to the substrate with the surfactant attached, or is positioned adjacent to the substrate, irradiation with the vacuum ultraviolet radiation is executed. The photomask is provided with a pattern corresponding to the gate electrode, and the irradiated sections and non-irradiated sections can be obtained in accordance with the pattern.

Subsequently, the substrate is dipped in the catalytic agent fluid to attach the catalytic agent to either one of the irradiated sections or the non-irradiated sections. As already described, the sections to which the catalytic agent are attached are determined depending on the polarity of charge of the irradiated sections or the non-irradiated sections and the polarity of the charged particles of the catalytic agent or the catalytic agent pre-processing agent.

Referring to FIG. 6A, the substrate 2*a* with the catalytic agent 30*a* attached is dipped in the plating fluid 33*a* to form the gate electrode 7*a*.

A cleaning process with purified water or the like can be executed between the above processes if necessary.

The step of forming the gate insulation layer is described next.

Referring to FIG. 6B, the gate insulation layer 6*a* is formed on the gate electrode 7*a*. The gate electrode 6*a* is formed by the process already described above. The coating method in which the gate insulation layer 6*a* is formed by a coating solution or a liquid material is particularly effective. The spin coating process or the inkjet process may correspond to the coating method. FIG. 6B shows the substrate 2*a* with the gate insulation layer 6*a* evenly formed thereon using the spin coating process.

The step of forming the source electrode and drain electrode will now be described. Referring to FIG. 6C, in order to form the source electrode 3*a* and the drain electrode 4*a* in the plating fluid 33*a*, the following steps will be executed.

The substrate is cleaned by purified water, alkali solution, or acid solution not only to remove organic matter contamination from the surface, but also to distribute negative charge to the surface evenly. A process using plasma generated in gas including oxygen is effective as well.

Next, the substrate is dipped in the aqueous solution to attach the surfactant to the surface of the substrate as a charge control agent.

Thereafter, while the photomask is adhered to the substrate with the surfactant attached, or is positioned adjacent to the substrate, irradiation with the vacuum ultraviolet radiation is executed. The photomask is provided with a pattern corresponding to the source electrode and the drain electrode, and the irradiated sections and non-irradiated sections can be obtained in accordance with the pattern. The pattern on the photomask corresponding to the source electrode and the drain electrode need to be aligned to the gate electrode already formed on the substrate. Namely, the photomask is aligned so that the gap (channel section) between the source electrode and the drain electrode overlaps the gate electrode.

Subsequently, the substrate is dipped in the catalytic agent fluid to attach the catalytic agent to either one of the irradiated sections or the non-irradiated sections. As already described, the sections to which the catalytic agent are attached are determined depending on the polarity of charge of the irradiated sections or the non-irradiated sections and the polarity of the charged particles of the catalytic agent or the catalytic agent pre-processing agent.

Next, referring to FIG. 6C, the substrate 2*a* with the catalytic agent 30*a* attached is dipped in the plating fluid 33*a* to form the source electrode 3*a* and the drain electrode 4*a*.

A cleaning process with purified water or the like can be executed between the above processes if necessary.

A step of removing organic matters will now be described. In order to remove organic matter attached to the surfaces of the source electrode 3*a* and the drain electrode 4*a*, the substrate 2*a* is exposed to plasma generated in gas including oxygen. The organic matter reacts with oxygen and is removed from the surfaces of the electrodes as carbon dioxide gas or water. Cleaning with an aqueous solution of a surfactant or an organic solvent is also effective to remove organic matter, and the combination of the above is also possible.

A step of forming an organic semiconductor layer will now be described. Referring to FIG. 6D, the organic semiconductor layer 5*a* is formed on the gate insulating layer 6*a*, the source electrode 3*a*, and the drain electrode 4*a*. Although the evaporation process can be used, the coating process for a coating solution of organic semiconductor or a solution of the precursor thereof to form the organic semiconductor layer 5*a* may also be used. The spin coating process offers the highest productivity. In this case, the semiconductor layer is also formed on the gap region defined between the transistors. In some applications in which element separation is more preferable, the semiconductor in the gap region needs to be removed. The inkjet process which can easily form discrete organic semiconductor layers 5*a* for each transistor is the most suitable process.

Hereinafter, an electro-optical device equipped with the aforementioned transistor 1, 1*a* is described referring to an electrophoretic display device as an example.

Figure 7:
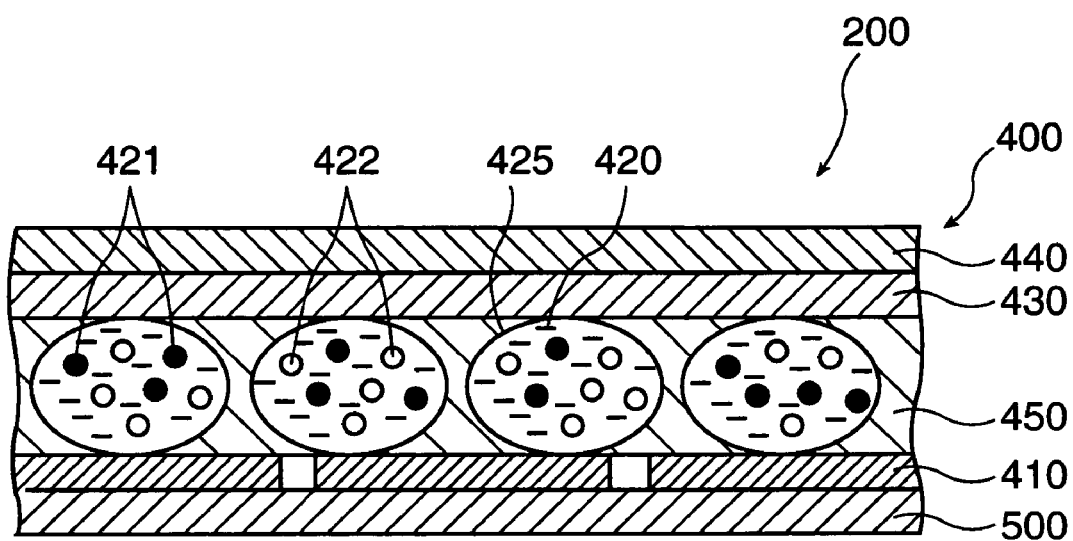
FIG. 7 is a vertical cross-sectional view showing applying a transistor to an electrophoretic display device according to an aspect the present invention.
Figure 8:
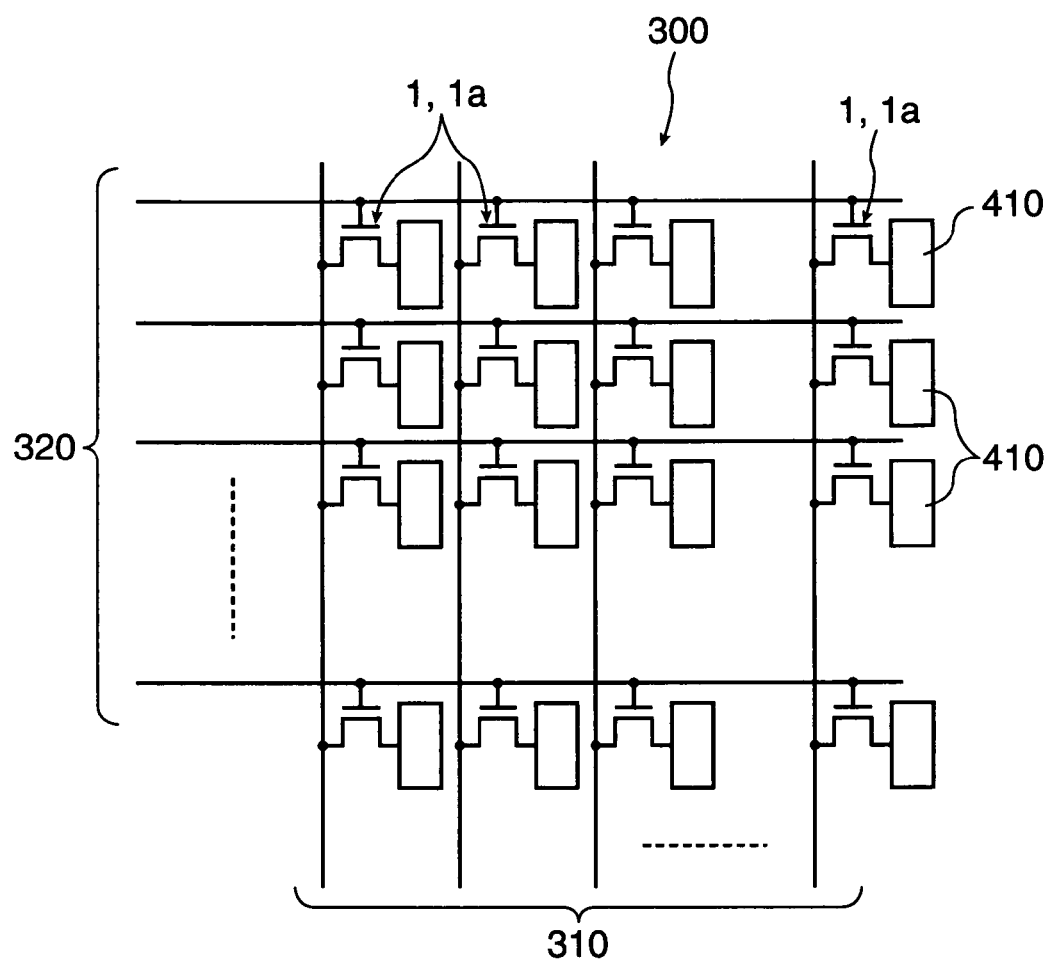
FIG. 8 is a block diagram showing an illustrative configuration of an active matrix circuit used with the electrophoretic display device shown in FIG. 7.

FIG. 7 is a vertical cross-sectional view showing an embodiment when a transistor according to the present invention is applied to an electrophoretic display device. FIG. 8 is a block diagram showing a configuration of an active matrix circuit installed in the electrophoretic display device shown in FIG. 7.

The electrophoretic display device 200 shown in FIG. 7 is composed of an active matrix circuit (not shown) provided on a substrate 500 and an electrophoretic display section 400 electrically connected to the active matrix circuit.

As shown in FIG. 8, the active matrix circuit 300 comprises a plurality of data lines 310, a plurality of scanning lines 320 perpendicular to the plurality of data lines 310, and transistors 1, 1*a* provided adjacent to each of the intersections of the data lines 310 and the scanning lines 320.

And, the gate electrodes, the source electrodes, and the drain electrodes provided in the transistors 1, 1*a* are respectively connected to the scanning lines 320, the data lines 310, and pixel electrodes (discrete electrodes) 410 described below.

As shown in FIG. 7, the electrophoretic display section 400 comprises the pixel electrodes 410, micro capsules 425, a transparent electrode (a common electrode) 430 and a transparent substrate 440 sequentially stacked on the substrate 500.

Further, a micro capsule 425 is fixed between a pixel electrode 410 and the transparent electrode 430 with a bonding member 450.

The pixel electrode 410 is divided into a matrix, namely so as to be aligned vertically and horizontally with regularity.

According to this aspect, encapsulated in each of the capsules 425 is electrophoretic dispersion liquid 420 including plural kinds of electrophoretic particles having different characteristics, two kinds of electrophoretic particles 421 and 422 having different charges and colors (hues).

An explanation for the electrophoretic display device 8 as described above is given as follows using FIG. 8. If one or more of the scanning lines are supplied with selection signals (selection voltages), the transistors 1, 1a connected to the scanning lines supplied with the selection signals (selection voltages) are switched on.

Thus, the data lines 310 connected to the transistors 1, 1a and the pixel electrodes 410 are substantially electrically connected. In this case, if the desired data (voltage) is supplied to the data line 310, the data (voltage) is then supplied to the pixel electrode 410.

Accordingly, an electric field is generated between the pixel electrode 410 and the transparent electrode 430, and the electrophoretic particles 421 and 422 are electrophoresed toward either of the electrodes in accordance with the direction and strength of the electric field, the characteristics of the electrophoretic particles 421 and 422, and so on.

Meanwhile, in this state, when the supply of the selection signal (selection voltage) to the scanning line 320 is stopped, the transistors 1, 1a are switched off bringing the data lines 310 and the pixel electrodes 410 connected to the transistors 1, 1a into an electrically disconnected state.

Therefore, by executing supplying or stopping the selection signals to the scanning lines 320, and supplying or stopping the data to the data lines 31 in desired combination, desired images (information) can be displayed on the display surface side (the transparent substrate 440 side) of the electrophoretic display device 200.

In particular, in the electrophoretic display device 200 according to the present illustrative embodiment, the electrophoretic particles 421 and 422 are differently colored, thus enabling images with multiple depths to be displayed.

Further, since the electrophoretic display device 200 according to the present illustrative embodiment is equipped with the active matrix circuit, the transistor 1, 1a connected to a specific scanning line 320 can selectively be switched ON/OFF, thus the problem of cross-talk can be minimized, and further faster circuit operation can be achieved, which can offer high quality images (information).

Further, since the electrophoretic display device according to the present illustrative embodiment can operate with lower drive voltages, lower power consumption can be realized.

Note that the transistor according to the present invention is not limited to the application to the electrophoretic display device described above, but can be applied to various electro-optical devices such as a liquid crystal display device, an organic or an inorganic EL display device, a plasma display device, and a device using an electron-emitter.

The electrophoretic display device as described above can be installed in various electronic apparatuses. The electronic apparatus according to the present invention equipped with the electrophoretic display device is hereinafter described.

Firstly, an illustrative embodiment of applying the electrophoretic display device of the present invention to the electronic paper is explained.

Figure 9:
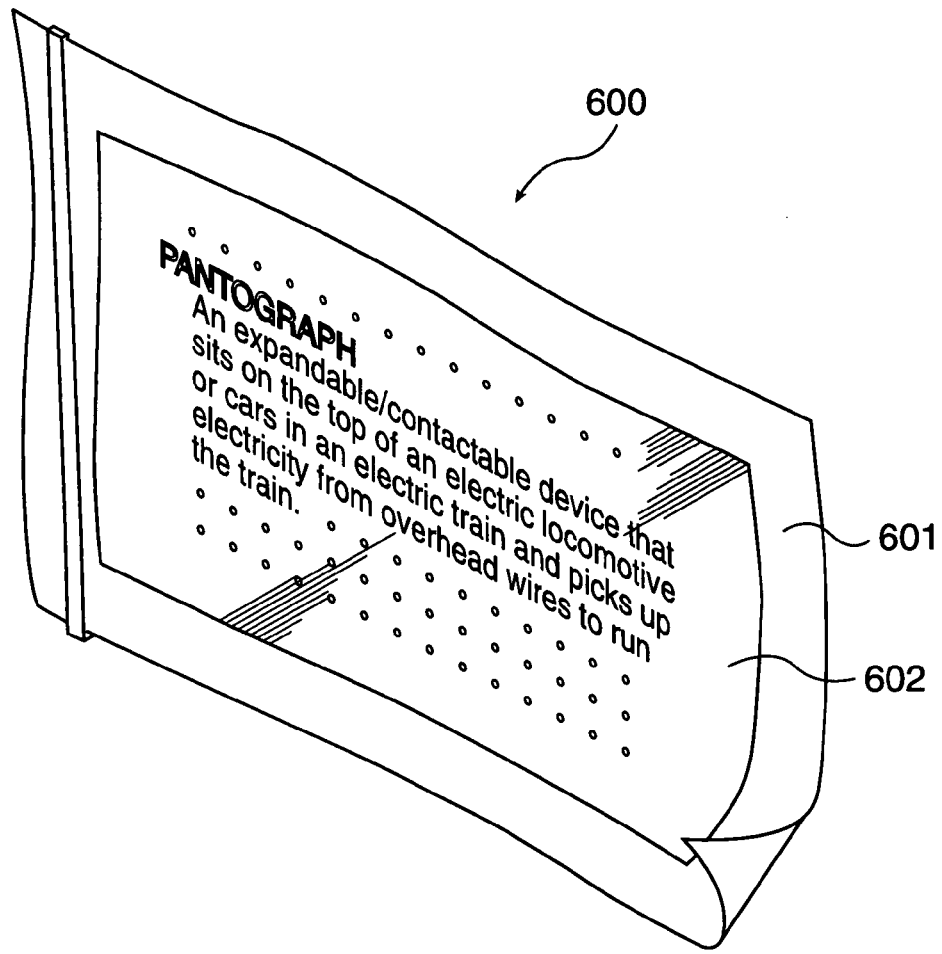
FIG. 9 is a perspective view showing applying an electrophoretic display device to electronic paper according to an aspect of the present invention.

FIG. 9 is a perspective view showing the embodiment of applying the electrophoretic device of the present invention to electronic paper.

The electronic paper 600 shown in this drawing is equipped with a main body 601 composed of a rewritable sheet offering the same texture and the same flexibility as paper and a display unit 602.

In the electronic paper 600 as described above, the display unit 602 is composed of the electrophoretic display device as described above.

Now, an illustrative embodiment of applying the electrophoretic device of the present invention to a display will be explained.

Figure 10A:
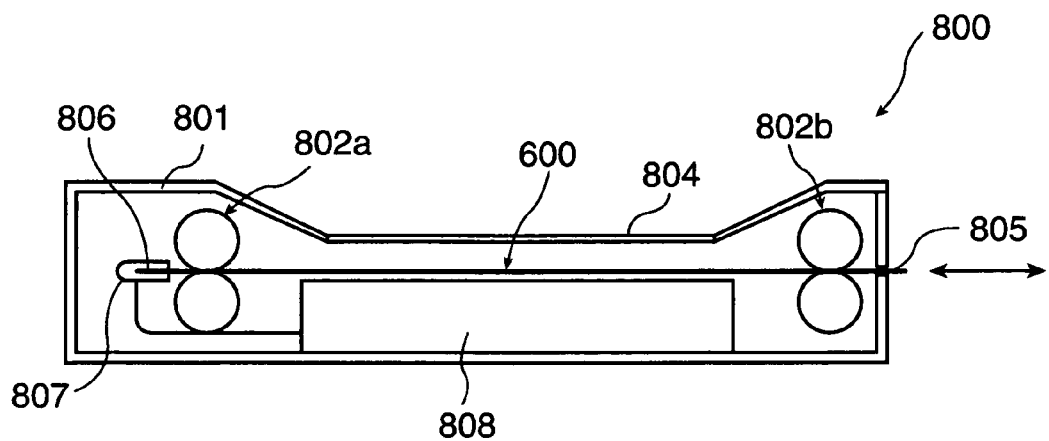
FIGS. 10A and 10B are schematic views showing applying an electrophoretic display device to a display according to an aspect of the present invention.
Figure 10B:
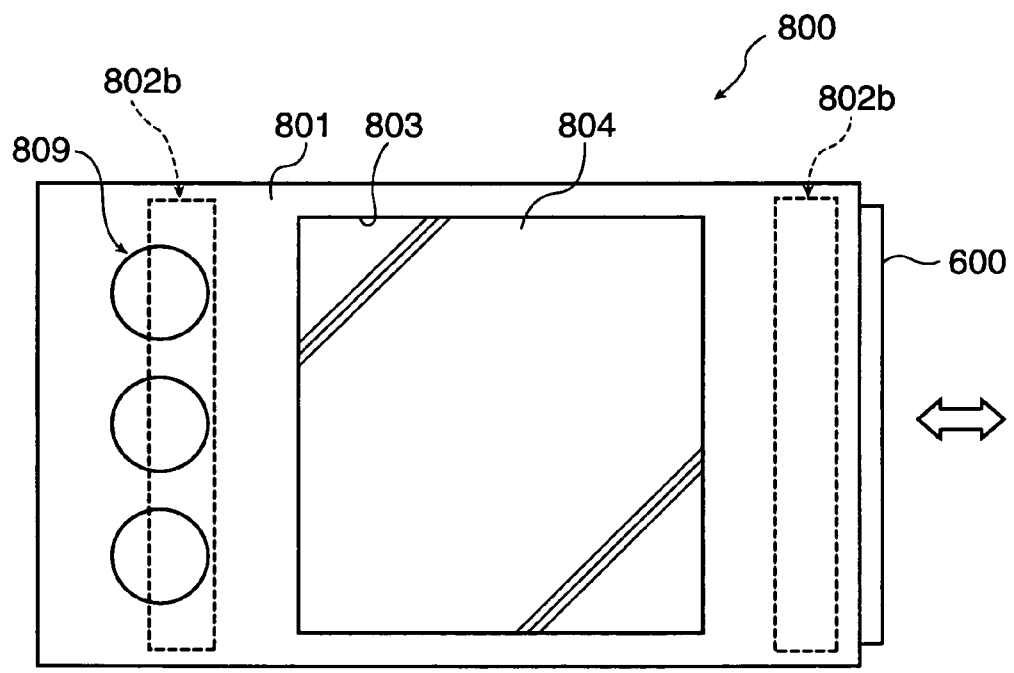

FIGS. 10A and 10B are views showing an illustrative embodiment of applying the electrophoretic device of the present invention to the display, where FIG. 10A is a cross-sectional view, and FIG. 10B is a plan view.

The display 800 shown in the drawing is equipped with a main body 801 and the electronic paper 600 detachably mounted on the main body 801. Note that the configuration of the electronic paper 600 is as described above, namely the same as the configuration shown in FIG. 9.

The main body 801 is provided with an inlet 805 at a side thereof (right side of the figure) through which the electronic paper 600 can be inserted, and with two pairs of feed rollers 802a and 802b inside thereof. When the electronic paper 600 is inserted in the main body 801 through the inlet 805, the electronic paper 600 is positioned in the main body 801 while being held by the pairs of feed rollers 802a and 802b.

Further, in the display side (the near side of the paper in FIG. 10B) of the main body 801, there is formed a rectangular hollow section 803, in which a transparent glass plate 804 is engaged. Thus, the electronic paper 600 inserted and positioned in the main body 801 can be viewed from outside the main body 801. Namely, in the display 800, the display surface is realized by making the electronic paper 600 positioned in the main body 801 be viewed through the transparent glass plate 804.

Further, a terminal section 806 is provided on the tip portion of the electronic paper 600 in the inserting direction (left side in the figure), and a socket 807 is provided inside the main body 801, to which the terminal section 806 is connected when the electronic paper 600 is positioned in the main body 801. The socket 807 is electrically connected to a controller 808 and an operation section 809.

In the display 800, since the electronic paper 600 is detachably mounted on the main body 801, it can also be carried and used while being detached from the main body 801.

Further, in the display 800 described above, the electronic paper 600 is composed of the electrophoretic display device as described above.

Note that the application of the electro-optical device equipped with the transistor according to the present invention is not limited to those described above, but includes, for example, a television, a video cassette recorder of either a view-finder type or a direct view type, a car navigation system, a pager, a personal digital assistant, an electronic calculator, an electronic newspaper, a word processor, a personal computer, a workstation, a picture phone, a POS terminal, and devices equipped with touch panels, and the electro-optical device equipped with the transistor according to the present invention can be applied to the display sections of the above various electronic apparatuses.

Although methods of manufacturing the transistor, the transistor circuit, the electro-optical device, and the electronic apparatus according to the present invention are described above, the present invention is not limited to these illustrative embodiments.

For example, although the transistor is described using a top-gate structure type, the present invention can also be applied to transistors of the bottom-gate type. In this case, the gate electrode can be formed using the electroless plating process.

Further, in the manufacturing method of the transistor according to the present invention, one or more of steps of desired purposes can be added if necessary.

Further, configuration of each section of the transistor, the electro-optical device, and the electronic apparatus can be replaced with a desired configuration capable of comparably functioning thereto or added to a desired configuration.

EXAMPLE 1

Specific examples according to the present invention are hereinafter described.

In the following examples, purified water is used as water unless otherwise described.

Firstly, a glass substrate with an average thickness of 0.7 mm is provided, cleaned with ammonia water, and then rinsed in water.

Then, the glass substrate is dipped in an aqueous solution (25° C.) of distearyl dimethyl ammonium chloride (cationic surfactant) for 60 seconds. Thus, distearyl dimethyl ammonium chloride is absorbed on the surface of the glass substrate. Subsequently, the glass substrate is washed with water.

Subsequently, the photomask made of quartz and provided with a chromium thin film on the region corresponding to the source electrodes and the drain electrodes is set on the glass substrate, and then irradiated with the vacuum ultraviolet radiation using the excimer VUV/03 cleaning equipment (produced by USHIO Inc., model: UER20-172A/B, lamp specification: dielectric barrier discharge excimer lamp filled with Xe gas). Note that in this example the distance (channel length) between the source electrode and the drain electrode is set to 10 µm, and the length (channel width) of the channel region in the direction perpendicular to the channel length direction is set to 500 µm.

Then, the glass substrate is dipped in a Sn—Pd colloidal suspension (25° C.) for 60 seconds. Thus, Sn—Pd can selectively be attached only to the region of the surface of the glass substrate corresponding to the source electrodes and the drain electrodes. Subsequently, the glass substrate is cleaned with water.

Then, the glass substrate is dipped in an aqueous solution (25° C.) including $HBF_4$ and glucose for 60 seconds. Thus, Sn is removed from the surface of the glass substrate to expose Pd on the surface of the glass substrate. Subsequently, the glass substrate is cleaned with water.

Then, the glass substrate is dipped in a Ni plating solution (80° C., pH 8.5) for 60 seconds. Thus, a Ni plated film with a thickness of 100 nm is formed on the surface of the glass substrate.

Note that the Ni plating solution is prepared by dissolving 10 g of nickel sulfate, 100 g of hydrazine (a reducing agent), and 5 g of ammonium sulfide (a pH adjuster) with 1 L of water.

Then, after removing the resist layer using the resist remover, the glass substrate with the source electrode and the drain electrode formed thereon is sequentially washed with water and methanol.

And then, the oxygen plasma process (the atmospheric pressure oxygen plasma process) is executed on the substrate with the source electrode and the drain electrode formed thereon under atmospheric pressure.

Note that, in the conditions of the atmospheric pressure plasma process, the RF power is set to be 300 W and the flow rate is set to be 80 sccm.

Subsequently, a 1% (wt/vol) toluene solution of F8T2 (fluorene-bithiophene copolymer) is coated on the glass substrate by the spin coating process (2400 rpm), and then dried at 60° C. for 10 minutes. Thus, the organic semiconductor layer with an average thickness of 50 nm is formed.

And then, a 5% (wt/vol) butyl acetate solution of polymethylmethacrylate (PMMA) is coated on the organic semiconductor layer by the spin coating process (2400 rpm), and then dried at 60° C. for 10 minutes. Further, a 2% (wt/vol) isopropyl alcohol solution of polyvinylphenol is coated thereon by the spin coating process (2400 rpm), and then dried at 60° C. for 10 minutes. Thus, the gate insulating layer with an average thickness of 500 nm can be formed.

And then, a water dispersion (viscosity of 5 cps at room temperature) of silver particles is coated on the gate insulating layer in an area corresponding to the region between the source electrode and the drain electrode by the inkjet process (20 pL droplet), and then dried at 80° C. for 10 minutes. Thus, the gate electrode with an average thickness of 100 nm can be formed.

After evaluating the transfer characteristics of the transistor shown in FIGS. 1A and 1B manufactured through the above steps, it is realized that the threshold voltage of −4V, the carrier mobility of $5\times10^{-3}$ cm/Vs, S value of 1.2 V/dec can be achieved.

EXAMPLE 2

The transistor shown in FIGS. 1A and 1B is manufactured using a polyimide substrate with a thickness of 60 microns instead of the glass substrate of the example 1 under the same conditions as those of the example 1 except the material of the substrate. After evaluating the transfer characteristics of the transistor shown in FIGS. 1A and 1B manufactured through the above steps, it is realized that the threshold voltage of −2V, the carrier mobility of $5\times10^{-3}$ cm/Vs, S value of 0.7 V/dec can be achieved.

EXAMPLE 3

The photomask made of quartz and provided with a chromium thin film on the region corresponding to the source electrodes and the drain electrodes is set on the polyimide substrate, and then irradiated with the vacuum ultraviolet radiation. And then, the substrate is dipped in the mixed aqueous solution of tin chloride(II) and hydrochloric acid at room temperature for 2 minutes, and then further dipped in the mixed aqueous solution of palladium chloride and hydrochloric acid at 40° C. for 3 minutes. The source electrode and the drain electrode are formed in Ni plating fluid, and the transistor shown in FIGS. 1A and 1B is manufactured under the same conditions as those of the example 1 except the plating conditions of these electrodes. After evaluating the transfer characteristics of the transistor shown in FIGS. 1A and 1B manufactured through the above steps, it is realized that the threshold voltage of −4V, and the carrier mobility of $5\times10^{-3}$ cm/Vs, S value of 1.5 V/dec can be achieved.

EXAMPLE 4

A polyimide substrate having the thickness of 70 microns is processed with oxygen plasma, and subsequently cleaned with an aqueous solution of sodium hydrate, and then rinsed in water.

Then, the polyimide substrate is dipped in an aqueous solution (25° C.) of distearyl dimethyl ammonium chloride (cationic surfactant) for 60 seconds. Thus, distearyl dimethyl ammonium chloride is absorbed on the surface of the polyimide substrate. Subsequently, the polyimide substrate is cleaned with water.

Subsequently, the photomask made of quartz and provided with a chromium thin film on the region corresponding to the gate electrodes is set on the polyimide substrate, and then irradiated with the vacuum ultraviolet radiation using the excimer VUV/03 cleaning equipment (produced by USHIO Inc., model: UER20-172A/B, lamp specification: dielectric barrier discharge excimer lamp filled with Xe gas).

Then, the polyimide substrate is dipped in a Sn—Pd colloidal suspension (25° C.) for 60 seconds. Thus, Sn—Pd is selectively attached to only the corresponding region of the surface of the substrate to the gate electrodes. Subsequently, the polyimide substrate is cleaned with water.

Then, the polyimide substrate is dipped in an aqueous solution (25° C.) including $HBF_4$ and glucose for 60 seconds. Thus, Sn is removed from the surface of the polyimide substrate to expose Pd on the surface of the polyimide substrate. Subsequently, the polyimide substrate is cleaned with water.

Then, the polyimide substrate is dipped in a Ni plating solution (80° C., pH 8.5) for 60 seconds. Thus, a Ni plated film with a thickness of 100 nm is formed on the surface of the polyimide substrate.

Note that the Ni plating solution is prepared by dissolving 10 g of nickel sulfate, 100 g of hydrazine (a reducing agent), and 5 g of ammonium sulfide (a pH adjuster) with 1 L of water.

Subsequently, 8% (wt/vol) butyl acetate solution of polymethylmethacrylate (PMMA) is coated on the gate electrode formed by an electroless plating process by the spin coating process (2400 rpm), and then dried at 60° C. for 10 minutes to form the gate insulation layer having the average thickness of 1200 nm.

Then, the polyimide substrate is dipped in an aqueous solution (25° C.) of distearyl dimethyl ammonium chloride (cationic surfactant) for 60 seconds. Thus, distearyl dimethyl ammonium chloride is absorbed on the surface of the polyimide substrate. Subsequently, the polyimide substrate is cleaned with water.

Subsequently, the photomask made of quartz and provided with a chromium thin film on the region corresponding to the source electrodes and the drain electrodes is set on the polyimide substrate, and then irradiated with the vacuum ultraviolet radiation using the excimer VUV/03 cleaning equipment. Note that the distance (channel length) between the source electrode and the drain electrode is set to 10 μm, and the length (channel width) of the channel region in the direction perpendicular to the channel length direction is set to 500 μm. When disposing the photomask on the substrate, it is aligned so that the channel section is positioned right above the gate electrode.

The source electrode and the drain electrode are completed by successively executing the same steps for forming the gate electrode by electroless plating.

Finally, mesitylene solution (1.4% wt/vol) of F8T2 (fluorene-bithiophene copolymer) is dropped on the channel region by the inkjet process to form the organic semiconductor layer.

After evaluating the transfer characteristics of the transistor shown in FIGS. 5A and 5B manufactured through the above steps, it is realized that the threshold voltage of −5V and the carrier mobility of $3 \times 10^{-3}$ cm/Vs, S value of 1.6 V/dec can be achieved.

The present invention is not limited to the illustrative embodiment described above, but various modifications are possible. For example, the present invention includes configurations (e.g., configurations having the same function, the same way, and the same result, or configurations having the same object and the same result) substantially the same as those described above. Further, the present invention includes configurations obtained by replacing a non-essential element of the configuration described above. Further, the present invention includes configurations offering the same advantage or configurations capable of achieving the same object as the configuration described above. Further, the present invention includes configurations obtained by adding technology known to the public to the configuration described above.

The invention claimed is:

1. A method of manufacturing a transistor, comprising:
    forming a source electrode and a drain electrode over a substrate by an electroless plating method, the source electrode having a thickness in the range of 30 nm to 300 nm;
    forming an organic semiconductor layer over the source electrode and the drain electrode;
    forming an insulating layer over the semiconductor layer; and
    forming a gate electrode over the insulating layer, wherein the electroless plating method includes:
        attaching charge control agents to a first region of the substrate, each of the charge control agents being a cationic surfactant;
        irradiating a first part of the first region with a light using a photomask to remove a part of the charge control agents on the first part of the first region;
        attaching at least one of a catalytic agent and a precursor of the catalytic agent to a second part of the first region, which is different from the first part of the first region; and
        depositing a metallic layer from a metal salt solution on the second part of the first region attached with one of the catalytic agent and the precursor of the catalytic agent to form the source electrode and the drain electrode.

2. The method of manufacturing a transistor according to claim 1, wherein a channel length between the source electrode and the drain electrode is in the range of 5 μm to 20 μm.

3. The method of manufacturing a transistor according to claim 1, wherein a channel width between the source electrode and the drain electrode is in the range of 0.05 mm to 5 mm.

4. The method of manufacturing a transistor according to claim 1, wherein a channel width between the source electrode and the drain electrode is in the range of 0.1 mm to 2 mm.

5. The method of manufacturing a transistor according to claim 1, wherein the thickness of the source electrode is in the range of 50 nm to 150 nm.

6. The method of manufacturing a transistor according to claim 1, wherein the source electrode includes at least one of Pt, Pd, Ni, Cu, and Au.

7. The method of manufacturing a transistor according to claim 6, wherein the organic semiconductor material includes including a conjugated polymer.

8. The method of manufacturing a transistor according to claim 1, wherein the substrate is a polyimide substrate.

9. The method of manufacturing a transistor according to claim 1, wherein the electroless plating method uses a plating solution that is not including alkali ion.

* * * * *